(12) United States Patent
Judge et al.

(10) Patent No.: US 6,883,885 B2
(45) Date of Patent: Apr. 26, 2005

(54) FRONT RELEASE FOR A SLIDE ASSEMBLY

(75) Inventors: Ronald John Judge, Corona, CA (US); John Nan-Heng Young, Irvine, CA (US); Paul Cirocco, Yorba Linda, CA (US)

(73) Assignee: Jonathan Manufacturing Corporation, Irvine, CA (US)

( * ) Notice: Subject to any disclaimer, the term of this patent is extended or adjusted under 35 U.S.C. 154(b) by 0 days.

(21) Appl. No.: 10/254,826

(22) Filed: Sep. 25, 2002

(65) Prior Publication Data

US 2003/0111942 A1 Jun. 19, 2003

Related U.S. Application Data

(63) Continuation-in-part of application No. 10/028,030, filed on Dec. 19, 2001, now Pat. No. 6,655,763.

(51) Int. Cl.[7] .............................................. A47B 88/00
(52) U.S. Cl. .................................. 312/334.46; 312/333
(58) Field of Search ............................ 312/333, 334.46, 312/334.44, 334.47; 384/21; 361/726

(56) References Cited

U.S. PATENT DOCUMENTS

| | | | |
|---|---|---|---|
| 3,107,958 A | | 10/1963 | Robbins |
| 3,462,203 A | * | 8/1969 | Vecchio ....................... 384/19 |
| 4,549,773 A | | 10/1985 | Papp et al. |
| 4,560,212 A | | 12/1985 | Papp et al. |
| 5,169,238 A | * | 12/1992 | Schenk ......................... 384/21 |
| 5,405,195 A | | 4/1995 | Hobbs |
| 5,417,490 A | | 5/1995 | Hobbs et al. |
| 5,484,197 A | | 1/1996 | Hansen et al. |
| 5,551,775 A | | 9/1996 | Parvin |
| 5,730,514 A | | 3/1998 | Hashemi |
| 5,757,109 A | | 5/1998 | Parvin |
| 5,961,193 A | | 10/1999 | Hobbs |
| 6,126,255 A | * | 10/2000 | Yang ...................... 312/334.46 |
| 6,367,899 B1 | * | 4/2002 | Hwang et al. ......... 312/334.47 |
| 6,373,707 B1 | | 4/2002 | Hutchins |
| 6,375,290 B1 | | 4/2002 | Lin et al. |
| 6,390,575 B1 | * | 5/2002 | Chen et al. ............. 312/334.46 |
| 6,412,891 B1 | * | 7/2002 | Liang et al. ........... 312/334.44 |
| 6,450,600 B1 | * | 9/2002 | Chen et al. ............. 312/334.46 |
| 6,554,379 B1 | | 4/2003 | Devine |
| 6,585,337 B1 | * | 7/2003 | Chen et al. ............. 312/334.46 |
| 6,817,685 B1 | * | 11/2004 | Lammens ............... 312/334.47 |
| 2002/0021061 A1 | * | 2/2002 | Lammens ............... 312/334.44 |
| 2004/0080245 A1 | * | 4/2004 | Lammens et al. .......... 312/333 |

FOREIGN PATENT DOCUMENTS

| | | | | | |
|---|---|---|---|---|---|
| JP | 03165712 A | * | 7/1991 | ........... | A47B/88/04 |
| JP | 07039430 A | * | 2/1995 | ........... | A47B/88/04 |

\* cited by examiner

*Primary Examiner*—Janet M. Wilkens
(74) *Attorney, Agent, or Firm*—Knobbe Martens Olson & Bear LLP

(57) ABSTRACT

A slide assembly is provided comprising a stationary slide segment, an intermediate slide segment, and a load-carrying slide segment. A bearing assembly is provided between the segments to reduce the friction therebetween. A lock arm extends from the load-carrying slide segment and is engageable with an engagement surface of the intermediate slide segment to limit movement of the load-carrying slide segment with respect to the intermediate slide segment when the load-carrying slide segment is fully extended. An elongated release member is slidably disposed within the channel of the load-carrying member, and as the release member is displaced inwardly, it depresses the lock arm thereby actuating the release mechanism by disengaging the lock arm from the engagement surface. The release mechanism remains actuated until the load-carrying slide segment is fully inserted into the intermediate slide member.

34 Claims, 25 Drawing Sheets

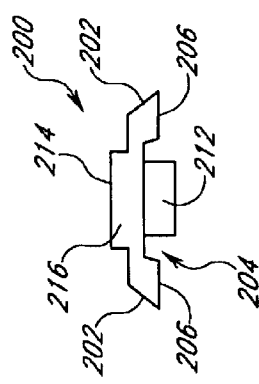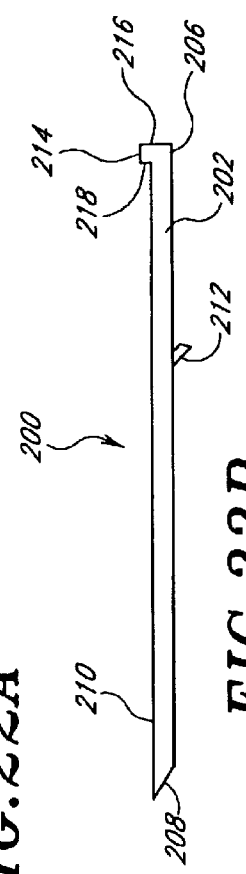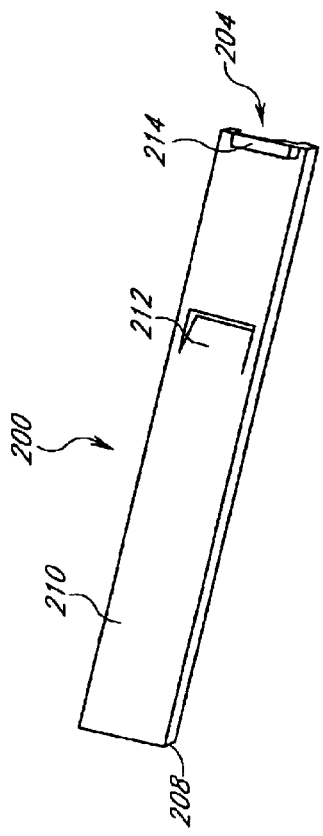

FRONT RELEASE FOR A SLIDE ASSEMBLY

RELATED APPLICATION

This application is a continuation-in-part of U.S. application Ser. No. 10/028,030, filed Dec. 19, 2001, now U.S. Pat. No. 6,655,763, which is hereby expressly incorporated by reference in its entirety.

BACKGROUND OF THE INVENTION

1. Field of the Invention

The present invention relates to slide assemblies and, more particularly, to a front release mechanism for a slide assembly.

2. Description of the Related Art

Computer servers for computer systems are often mounted in rack structures for convenience and to conserve floor space. Typically, several computer servers are spaced vertically and mounted in each rack structure. To facilitate access to the individual servers for maintenance or upgrades, each server is typically mounted on a pair of slide assemblies to allow the server to slide into and out of the rack structure.

Typical slide assemblies comprise two or more telescoping slide segments. An outer or stationary slide segment is mounted to a frame of the rack structure, and an inner or load-carrying slide segment is mounted to the server. The stationary slide segment is usually C-shaped and defines a channel in which the inner slide segment is slidable to extend or retract the slide assembly. A ball-bearing assembly is movably positioned in the channel to facilitate sliding engagement of the inner slide segment with respect to the outer slide segment. Other types of bearing assemblies, such as solid-bearing slide assemblies are also used.

Many slide assemblies additionally contain an intermediate slide segment that interconnects the stationary slide segment and the load-carrying slide segment and allows a greater length of extension, thus allowing a rack-mounted server to extend beyond the confines of the rack structure for increased access. Many slide assemblies further contain a lock-out mechanism to maintain the position of the server computer once the slide assembly is fully extended and to prevent the unintentional detachment of the load-carrying slide segment from the slide assembly. The lock-out feature conveniently allows the slide assembly to remain securely extended while performing work on the computer.

The location of the lock-out mechanism is dictated, in part, by the strength requirements of the telescoping slide segments. Server computers usually require a robust slide assembly to adequately support their weight, and slide assemblies constructed for this purpose must be able to withstand significant bending moments when extended. Therefore, each extended slide segment must be securely supported by the preceding segment, which usually allows roughly half of any given slide segment to extend beyond the outer end of the preceding segment. Accordingly, there is an overlap of the rearward portion of the load-carrying segment and the forward portion of the preceding segment. Most lock-out mechanisms are positioned within this overlap.

This is an inconvenient lock-out mechanism location when attempting to release and retract the server computer. To disengage typical lock-out mechanisms, a technician manually actuates a release, such as by pivoting a latch about its attachment point to disengage a cutout on the latch from a flange protruding from the slide segment. Accordingly, the technician must reach to the rearward portion of the load-carrying member to actuate the release mechanism. Typically, a technician must simultaneously actuate both lock-out mechanisms and apply a retracting force to the server computer. This can be difficult, or even impossible, appreciating that the slide assemblies are usually mounted on opposing sides of the server, and a technician must simultaneously reach both lock-out mechanisms.

Moreover, once actuated, many lock-out mechanisms do not maintain a disengaged state and are biased to return to a locked state if the manual actuation is released before the load-carrying segment begins retracting into a preceding slide segment. Therefore, not only must a technician simultaneously reach both lock-out mechanisms, but the technician must also manually hold them in an actuated state while exerting a retracting force on the server computer. Not only does it require dexterity and coordination to simultaneously actuate multiple lock-out mechanisms, but the technician must then exert an additional force on the computer server, which requires a technician to exert a retracting force without the use of his hands, or in the case of a heavy load, a second technician must exert the retracting force.

SUMMARY OF THE INVENTION

According to one aspect, a slide assembly comprises a stationary slide segment having an upper wall, a lower wall, and a side wall extending between the upper and lower walls. A first channel is defined by the upper wall, lower wall, and side wall. An intermediate slide segment is movable in the first channel to extend outwardly or retract inwardly. The intermediate slide segment has an upper wall, a lower wall, and a side wall extending between the upper and lower walls thereby defining a second channel. The intermediate slide segment further defines an engagement surface.

A load-carrying slide segment is movable in the second channel to extend or retract the slide assembly. The load-carrying slide segment has an upper wall, a lower wall, and a side wall extending between the upper and lower walls thereby defining a third channel.

A lock arm extends from the side wall of the load-carrying slide segment toward the intermediate slide segment side wall, and is engageable with the engagement surface to limit movement of the load-carrying slide segment with respect to the intermediate slide segment.

A front release mechanism comprises an elongate release member that is slidably disposed with the third channel and is configured to engage the lock arm and displace it thereby disengaging the lock arm and the engagement surface. The lock arm is actuatable from a front end of the load carrying member.

The lock arm may be a resilient cantilevered spring that is securely attached to the load-carrying member side wall, and may be configured with a window formed therein for cooperating with an protrusion extending away from the intermediate slide segment side wall and configured to fit within the window.

In one embodiment, the elongate release member is configured such that an inward displacement of the release member causes displacement of the lock arm in a plane that is substantially transverse to a vertical plane. The elongate release member may be further configured with a stop tab located to engage a portion of the inner slide segment thereby inhibiting undesired withdrawal of the release member from the inner slide segment.

The slide assembly may further have a reset feature that aligns a front end of the release member with a front end of the load-carrying slide segment, and may be in the form of a reset tab on the intermediate slide segment configured to engage a flange formed at a front end of the release member thereby inhibiting continued retraction of the release member and thereby aligning the front ends of the release member and the load-carrying slide segment as said load-carrying slide segment is fully retracted into the second channel.

According to another aspect, a telescoping slide assembly has interconnected load-carrying, intermediate, and stationary slide members movable relative to one another to extend in an outward direction and retract in an inward direction. The load-carrying and intermediate slide members move relative to the stationary slide member between fully extended and retracted positions. The intermediate slide member interconnects the load-carrying member and the stationary slide member. The slide assembly further includes a lock-out mechanism for locking the slide assembly in the fully extended position. The lock-out mechanism includes a resilient cantilevered lock arm having a first end secured to the load-carrying member, a middle section extending toward the intermediate slide segment, and a second end terminating in a lip that is configured with a window for receiving a protrusion formed on the intermediate slide member. A protrusion extends from the intermediate slide member toward the load-carrying member and is configured to fit within the lock arm window when the load-carrying member is fully extended.

An elongated release member is slidably disposed within the channel of the load-carrying member such that a first end is adjacent to the lock arm lip and a second end is adjacent to an outward end of the load-carrying member. The elongated release member is translated inwardly to cause the elongated release member first end to depress the lock arm lip thereby elastically deforming the lock arm such that the lock arm window moves away from the protrusion thereby allowing relative movement of the intermediate member and the load-carrying member.

According to another aspect of the present front release for a slide assembly, a method for unlocking and retracting a load carried by a pair of extended slide assemblies in which each slide assembly comprises a release member selectively movable between a locked position and a release position is presented. A first actuating force is applied to a first release member thereby moving the first release member to its release position. The first release member preferably remains in its release position without further application of actuating force. A second actuating force is applied to a second release member thereby moving the second release member to its release position. The second release member preferably remains in its release position without further application of actuating force. A retracting force is applied to the load thereby retracting the slide assemblies.

An additional step may comprise resetting the first and second release members. In addition, the pair of extended slide assemblies are each capable of disconnecting a load carrying segment from the remainder of the slide assembly, and wherein applying a first actuating force to the first release member and/or applying a second actuating force to a second release member allows only unidirectional movement of the load carrying segments in a retracting direction.

According to yet another aspect, a lock-out slide mechanism for locking a telescoping slide in an extended position comprises a first slide member having an outward end from which the slide telescopes and an inward end toward which the slide retracts and further has an engagement surface.

A second slide member has an outward end and an inward end and is slidably connected to the first slide member such that the second slide member is slidable relative to the first slide member. A lock arm, which may be resilient, is attached to the second slide member and is configured to move in a direction substantially transverse to a vertical plane and has an interference surface configured to engage the engagement surface thereby inhibiting the movement of the second slide member relative to the first slide member.

An elongated lock release member is slidably positioned along the second slide member and is configured such that inwardly displacing the elongated lock release member displaces the lock arm in a direction substantially transverse to a vertical plane thereby disengaging the interference surface from the engagement surface thus allowing relative movement of the second slide member and the first slide member.

The elongated lock release member may be formed of a single piece, and may be securely held by the second slide member. The elongated release member is preferably displaceable a distance within the range of about one eighth to one half of an inch, and in one embodiment, is displaceable a distance of about one quarter of an inch.

The lock arm may be formed of a resilient material and may be fixedly attached to the second slide member.

According to yet another aspect, a slide assembly is provided having an outer slide member with a generally C-shaped section have a pair of upper and lower bearing raceways facing vertically inward. An intermediate slide member has a generally C-shaped section having a pair of upper and lower bearing raceways facing vertically outward and further having a first interengaging surface. A first plurality of upper and lower bearings are in rolling engagement with respective upper and lower raceways of the outer and intermediate slide members.

An inner slide member has a generally C-shaped section defining a longitudinal channel therein and having a pair of upper and lower bearing raceways facing vertically outward. A second plurality of upper and lower bearings are in rolling engagement with the pair of upper and lower bearing raceways of the inner slide member and a second pair of opposed vertically inward facing upper and lower bearing raceways of the intermediate slide member.

A lock arm is fixedly attached to an inward surface of the inner slide member which defines a second interengaging surface configured to engage the first interengaging surface of the intermediate slide member to inhibit the relative movement of the inner slide member with respect to the intermediate slide member. An elongated release member is slidably disposed within the inner slide member channel and is held in place by the inner slide member channel and is further configured to translate longitudinally to displace the lock arm and thereby disengage the first interengaging surface and the second interengaging surface.

The release member can engage the lock arm such that the lock arm is resiliently deflected away from the first interengaging surface. Moreover, the first interengaging surface may comprise a tab extending from the intermediate slide member toward the inner slide member and is configured to fit within a window formed in the lock arm when the inner slide member is fully extended. In one embodiment, the elongated release member may be held in place by the walls defining the generally C-shaped section of the inner slide member channel.

According to still another aspect, a carriage, which in one embodiment is a computer, is carried by a pair of telescoping slide assemblies in which the slide assemblies each comprise a plurality of telescoping slide segments movable between an extended position and a retracted position. A first slide segment is mounted to a stationary structure and a second slide segment is fixed to the carriage. Each of the slide assemblies comprise a lock-out mechanism that locks the slide assemblies in an extended position. A front lock release mechanism is provided for releasing the lock by actuating a release member disposed generally at a front end of the second slide segment.

The pair of telescoping slide assemblies may further comprise a removal mechanism whereby the second slide segment is removable from the slide assembly. In one embodiment, the release mechanism maintains the lock-out mechanism in a released state until reset, which may be upon full retraction of the second slide segment.

These and other features, aspects and advantages of the present invention will now be described with reference to the drawings of preferred embodiments, which embodiments are intended to illustrate and not to limit the present invention. The drawings comprise twenty-seven figures.

BRIEF DESCRIPTION OF THE DRAWINGS

FIGS. 22A,B,C illustrate one embodiment of an elongated release member configured to actuate the lock arm of FIG. 21.

DETAILED DESCRIPTION OF THE PREFERRED EMBODIMENT

Figure 1:
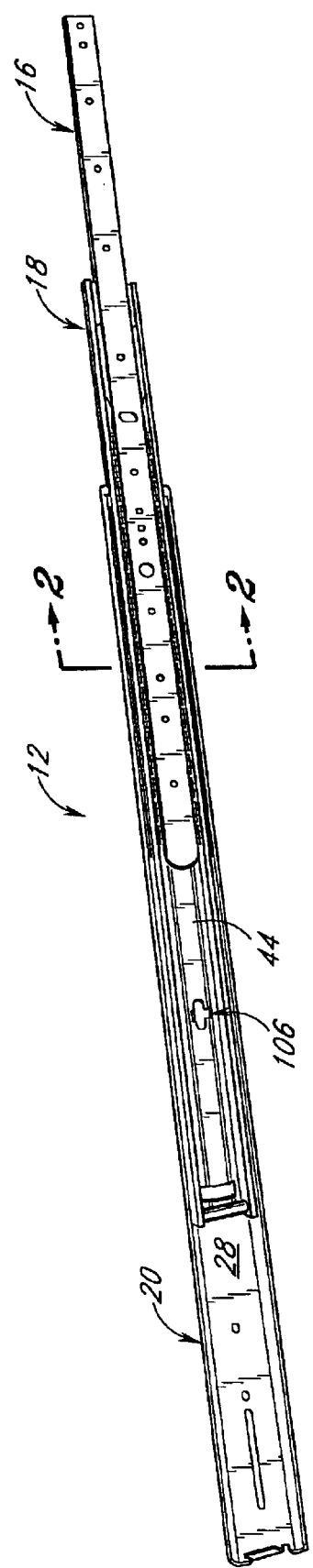
FIG. 1 is a perspective view of one embodiment of a slide assembly having certain features and advantages in accordance with the present invention.

A slide assembly having features in accordance with the present invention is illustrated in FIG. 1 and designated generally by the reference numeral 12. In the embodiment illustrated in FIG. 1, the slide assembly 12 includes a first or inner slide segment 16, a second or intermediate slide segment 18, and a third or outer slide segment 20. The inner slide segment 16 is adapted for mounting to an outer case or housing of a computer server (not shown). The outer slide segment 20 is adapted for mounting to a stationary server rack structure (not shown). Each computer server desirably is supported in the server rack structure by a pair of slide assemblies 12, one on either side of the computer server, to allow the computer server to slide in and out of the server rack structure.

Figure 2:
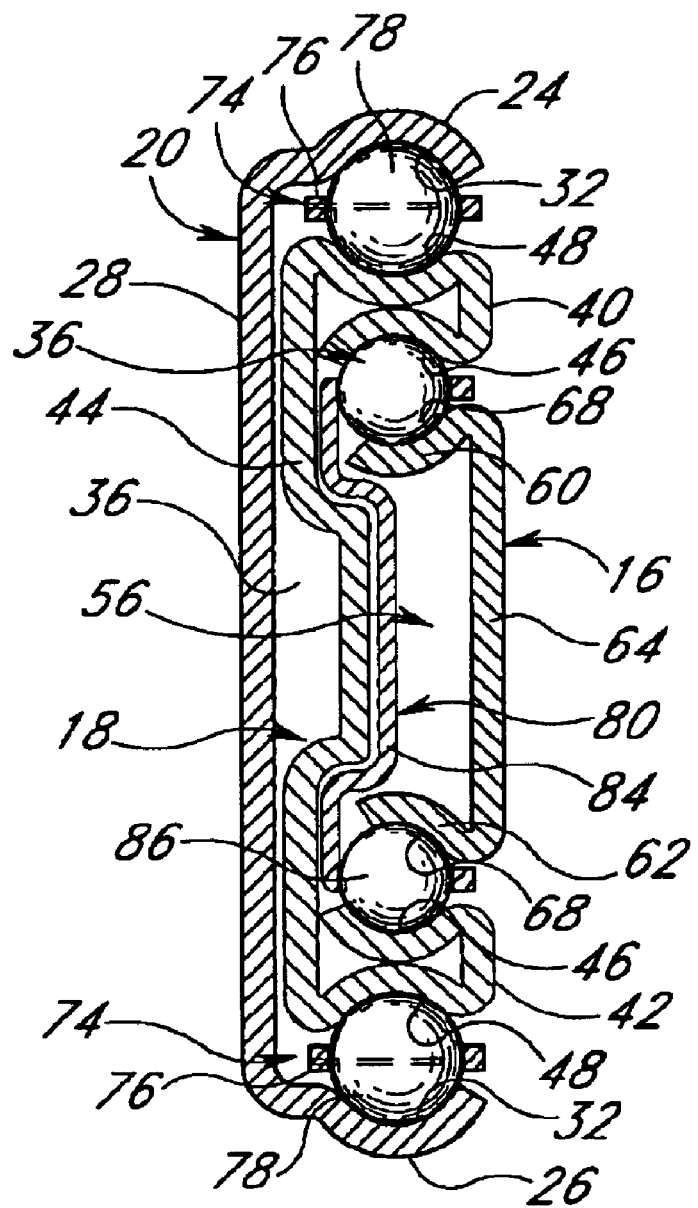
FIG. 2 is a cross-sectional view of the slide assembly of FIG. 1, taken along the line 2—2 of FIG. 1.

FIG. 2 is a cross-sectional view of the slide assembly 12 of FIG. 1, taken along the line 2—2 of FIG. 1. With reference to FIGS. 1 and 2, the outer slide segment 20 has a generally C-shaped cross-section and comprises an upper wall 24, a lower wall 26, and a planar side wall 28 extending between the upper and lower walls 24, 26. Each of the upper and lower walls 24, 26 defines an arcuate bearing surface 32. The bearing surfaces 32 generally face inward towards a central longitudinal axis of the slide assembly 12. A longitudinal channel 36 is defined by the bearing surfaces 32 and a planar inner surface of the side wall 28.

The intermediate slide segment 18 also has a generally C-shaped cross-section and comprises an upper wall 40, a lower wall 42, and a side wall 44 extending between the upper and lower walls 40, 42. Each of the upper and lower walls 40, 42 of the intermediate slide segment 18 defines an arcuate inner bearing surface 46 and an arcuate outer bearing surface 48. The inner bearing surfaces 46 face towards, and the outer bearing surfaces 48 face away from, the central longitudinal axis of the slide assembly 12. A longitudinal channel 56 is defined by the inner bearing surfaces 46 and an inner surface of the side wall 44.

Like the outer slide segment 20 and the intermediate slide segment 18, the inner slide segment 16 also has a generally C-shaped cross-section and comprises an upper wall 60, a lower wall 62, and a side wall 64 extending between the upper and lower walls 60, 62. Each of the upper and lower walls 60, 62 defines an arcuate bearing surface 68. The bearing surfaces 68 of the inner slide segment 16 face outward, or away from the central longitudinal axis of the slide assembly 12.

The intermediate slide segment 18 is positioned in the channel 36 of the outer slide segment 20 so that the bearing surfaces 32 of the outer slide segment 20 are located adjacent the outer bearing surfaces 48 of the intermediate slide segment 18. A bearing assembly 74 is positioned between each bearing surface 32 of the outer slide segment 20 and the adjacent outer bearing surface 48 of the intermediate slide segment 18. In the illustrated embodiment, each bearing assembly 74 comprises a thin, elongated, generally planar bearing spacer 76 and a number of spherical ball bearings 78. The ball bearings 78 are retained by the bearing spacer 76 in spaced-apart openings formed along the length of the bearing spacer 76. This is an example of one type of bearing spacer, and bearing spacers having varying configuration are contemplated. The ball bearings 78 roll against the bearing surfaces 32, 48 to facilitate longitudinal sliding movement of the intermediate slide segment 18 with respect to the outer slide segment 20. As will be appreciated, the bearings 78 are retained in the openings of the spacer 76 by the bearing surfaces 32, 48.

Referring still to FIGS. 1 and 2, the inner slide segment 16 is positioned in the channel 56 of the intermediate slide segment 18 so that the bearing surfaces 68 of the inner slide segment 16 are located adjacent the inner bearing surfaces 46 of the intermediate slide segment 18. A bearing assembly 80 is positioned in the channel 56 between the inner slide segment 16 and the intermediate slide segment 18 to facilitate longitudinal sliding movement of the inner slide segment 16 with respect to the intermediate slide segment 18. In the illustrated embodiment, the bearing assembly 80 comprises a bearing retainer 84 and a number of spherical ball bearings 86.

The bearing surfaces 32 of the outer slide segment 20, the inner and outer bearing surfaces 46, 48 of the intermediate slide segment 18, and the bearing surfaces 68 of the inner slide segment 16 desirably are concave. This prevents lateral separation of the intermediate slide segment 18 from the outer slide segment 20, and of the inner slide segment 16 from the intermediate slide segment 18.

Figure 3:
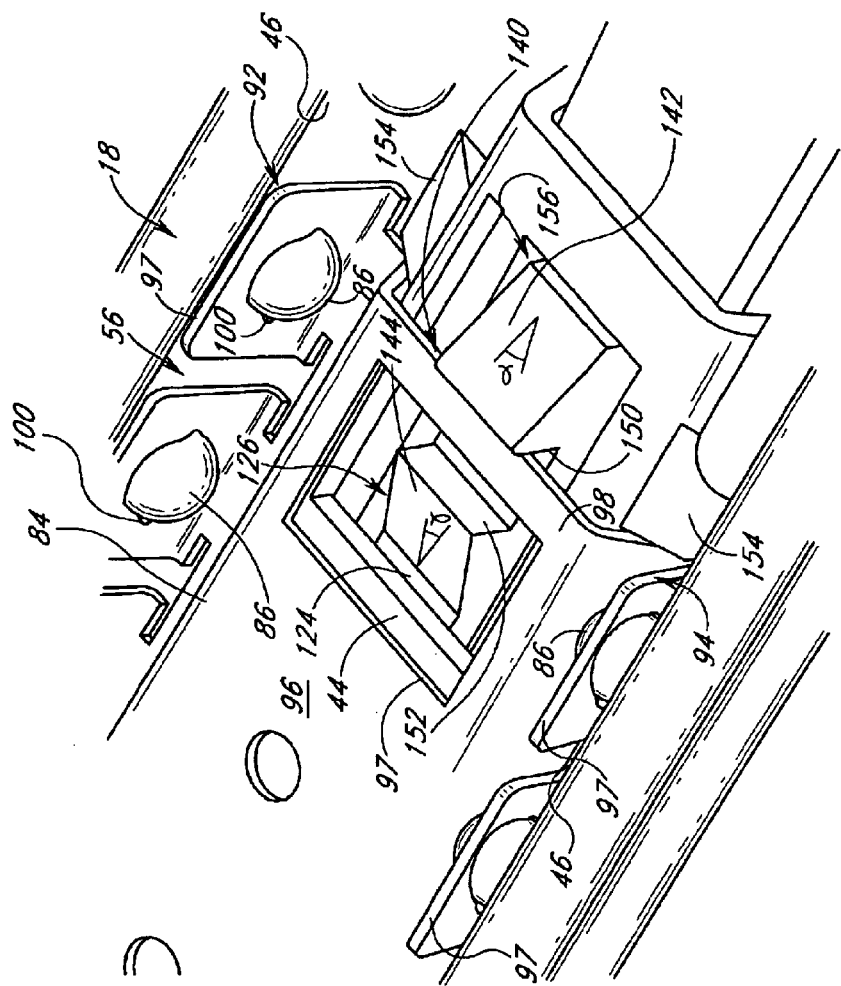
FIG. 3 is a perspective view of a portion of the intermediate slide segment of the slide assembly of FIG. 1, with the latch illustrated in a first position.

FIG. 3 is a perspective view of a portion of the intermediate slide segment 18 with the bearing assembly 80 positioned in the channel 56. In the illustrated embodiment, the bearing retainer 84 comprises an upper retainer portion 92, a lower retainer portion 94, and a side portion 96 interconnecting the upper and lower retainer portions 92, 94. An opening 97 is provided in the side portion 96. A cross-member 98 extends between the upper and lower retainer portions 92, 94. The bearing retainer 84 is seated in the channel 56 so that the upper and lower retainer portions 92, 94 are located adjacent the inner bearing surfaces 46, and the side portion 96 is located adjacent the inner surface of the side wall 44.

In the embodiment illustrated in FIG. 3, each of the upper and lower retainer portions 92, 94 comprises a number of tabs 97. The tabs 97 extend generally perpendicularly to the side portion 96 of the bearing retainer 84. Each tab 97 has a circular opening 100 provided therein to accommodate one of the ball bearings 86. The diameter of the openings 100 is preferably slightly less than the diameter of the ball bearings 86 to trap the ball bearings 86 between the tabs 97 and the inner bearing surfaces 46 of the intermediate slide segment 18.

The bearing assembly 80 desirably is movable along the length of the channel 56 of the intermediate slide segment 18. This allows the ball bearings 86 to roll along the inner bearing surfaces 46 of the intermediate slide segment 18 as the inner slide segment 16 is moved in and out of the channel 56. A rear stop 106 (see FIG. 1) is provided in a rear portion of the intermediate slide segment 18 to limit rearward movement of the bearing assembly 80. In the illustrated embodiment, the rear stop 106 comprises a laterally raised portion of the inner surface of the side wall 44 of the intermediate slide segment 18.

Figure 4:
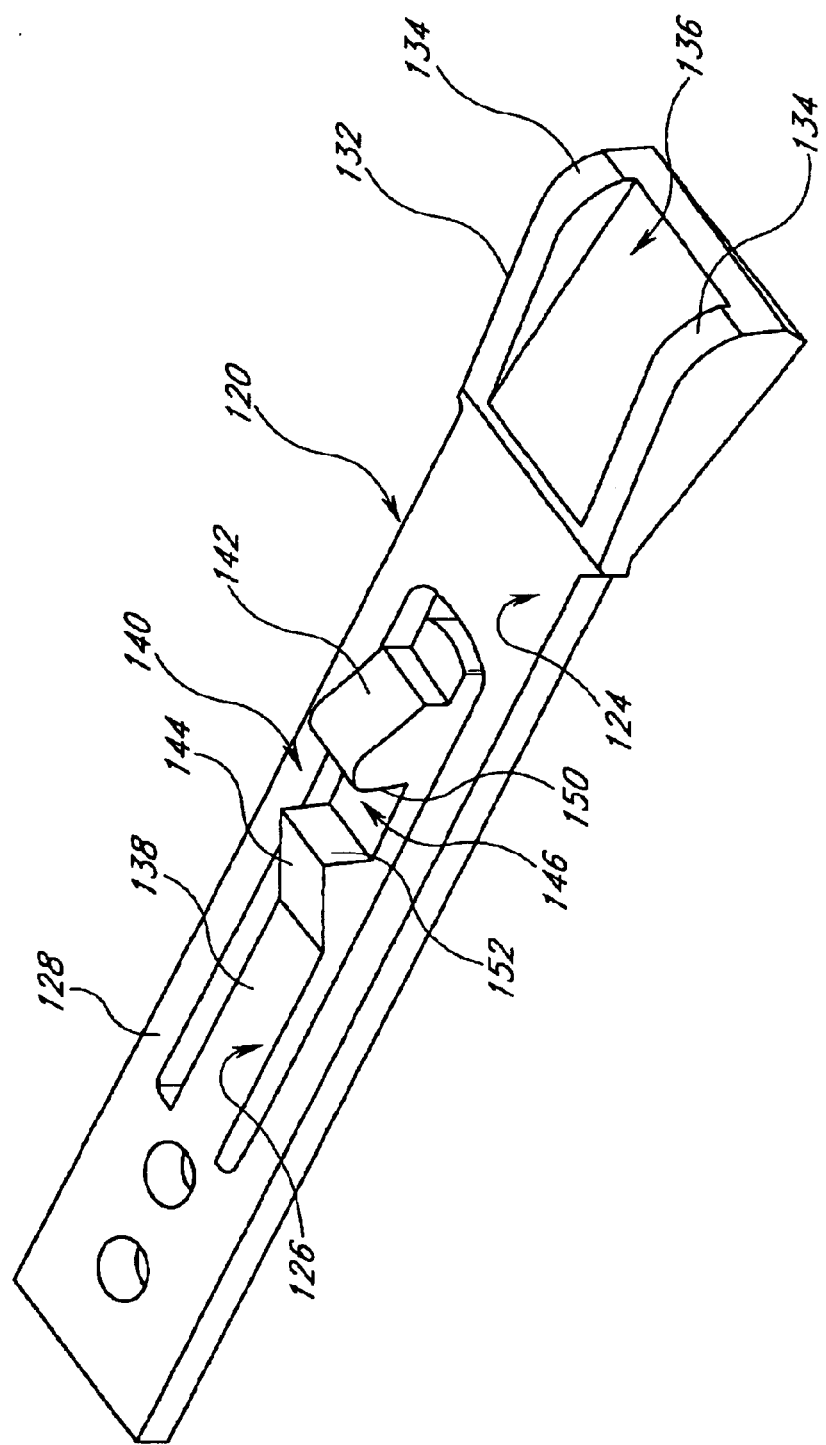
FIG. 4 is a perspective view of the controller of the slide assembly of FIG. 1.

With reference now to FIG. 4, one type of controller 120 for the slide assembly 12 is shown. In the illustrated embodiment, the controller 120 includes both an actuator 124 and a latch 126. This actuator 124 embodiment comprises a thin, planar, cantilevered primary arm 128 having an end portion 132 of increased thickness. The thickness of the end portion 132 is greatest near a front end of the controller 120. The end portion 132 desirably has rounded corners 134 and a groove 136 formed in the center thereof.

The latch 126 comprises a thin, planar, cantilevered secondary arm 138 having a raised locking portion 140 at a front end thereof. The locking portion 140 includes a generally planar sloping front face 142 and a generally planar sloping rear face 144. Desirably, the front face 142 extends a slightly greater distance above the planar surface of the secondary arm 138 than does the rear face 144. In the illustrated embodiment, a recess 146 is formed between the front face 142 and the rear face 144. The recess 146 is defined by a front locking surface 150 and a rear locking surface 152. Alternatively, the function of the front locking surface 150, which will be described below, can be performed by a pair of raised hard stops 154 (see FIG. 3) provided at the forward end of the channel 56.

The controller 120 desirably is formed of a stiff yet flexible material to allow the primary and secondary arms 128, 138 to flex or bend, and resiliently return to position. Preferably, the controller 120 is formed of a resilient, durable, low-friction plastic material, such as acetal.

Figure 5:
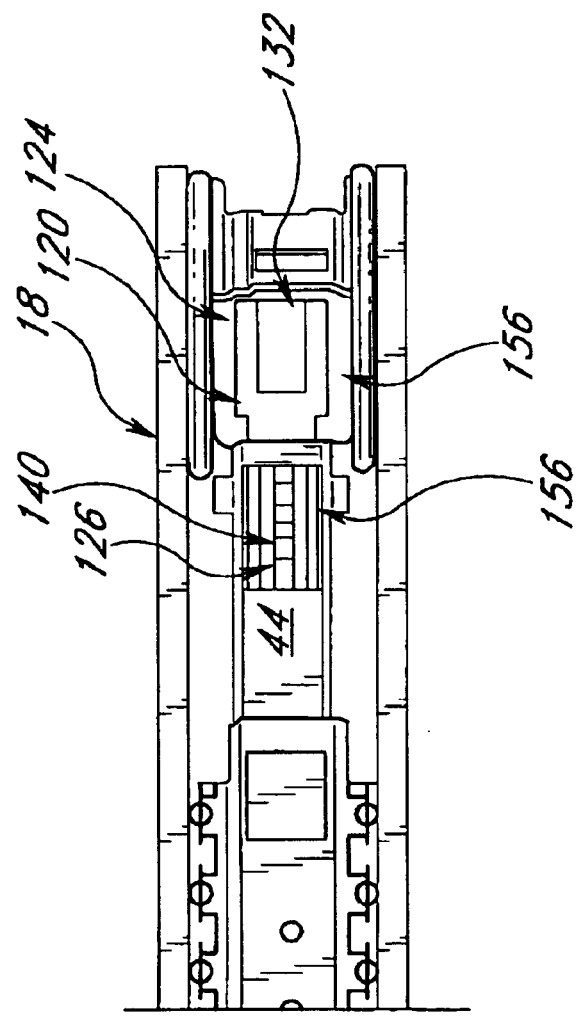
FIG. 5 is an elevational view of the forward end of the intermediate slide segment of the slide assembly of FIG. 1.
Figure 6:
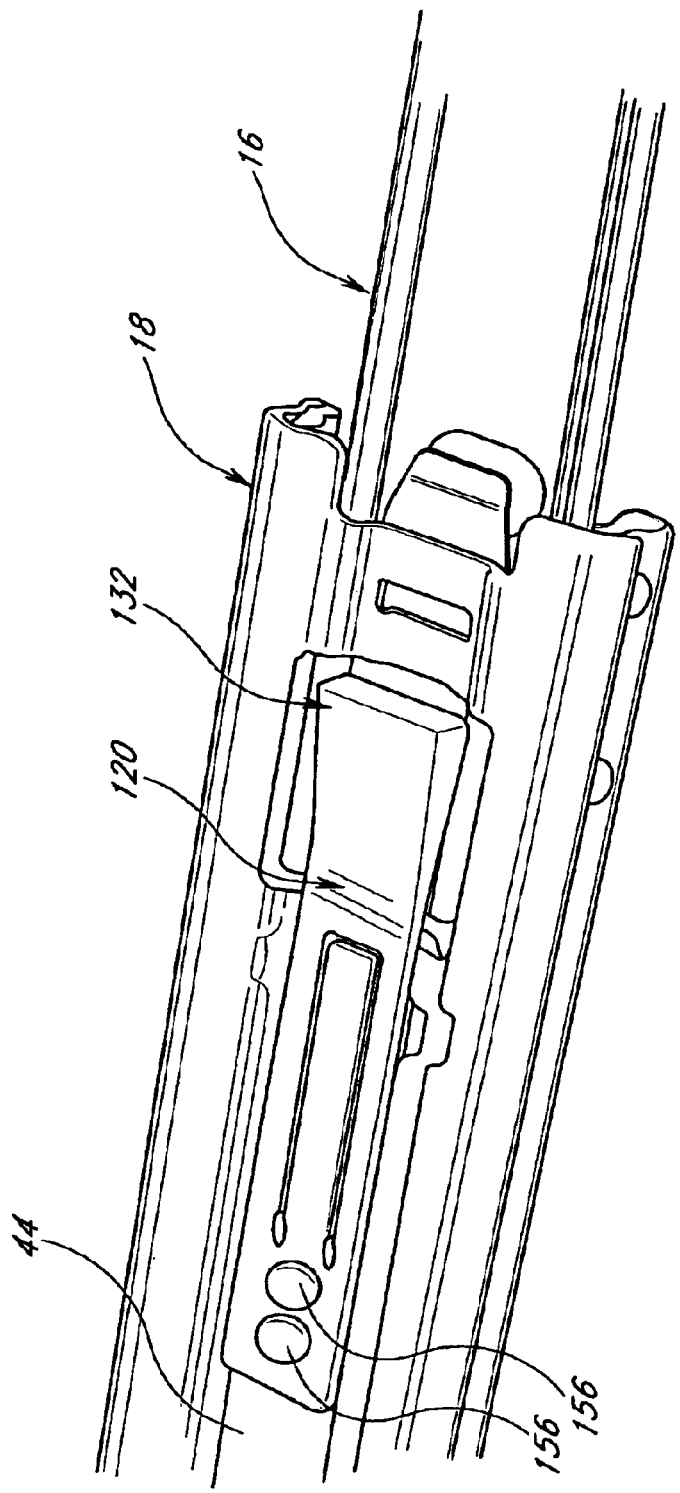
FIG. 6 is a perspective view of a portion of the inner slide segment and a portion of the intermediate slide segment of the slide assembly of FIG. 1, showing the attachment of the controller to the intermediate slide segment.

The forward end of the intermediate slide segment 18 is shown in FIG. 5. As illustrated, a pair of openings 156 are provided in the side wall 44 of the intermediate slide segment 18 near the forward end thereof. The controller 120 is positioned behind the side wall 44 so that the end portion 132 of the actuator 124 and the locking portion 140 of the latch 126 are in registration with the openings 156. The controller 120 is attached to an outer surface of the side wall 44 by suitable means, such as a pair of rivets 158 (see FIG. 6) that extend through openings formed in a side of the controller 120 opposite the end portion 132.

Referring again to FIG. 3, the latch 126 is illustrated in a first position, wherein the planar surface of the secondary arm 124 rests against the outer surface of the side wall 44 of the intermediate slide segment 18. The locking portion 140 of the latch 126 extends through one of the openings 156 in the side wall 44 and into the channel 56 of the intermediate slide segment 18.

To ensure proper operation of the latch 126, the front face 142 desirably forms an angle $\alpha$ with the plane of the side wall 44 of between 10 and 80 degrees when the latch 126 is in the first position illustrated in FIG. 3. More desirably, the angle $\alpha$ is between 30 and 45 degrees. Preferably, the angle $\alpha$ is 38 degrees. The rear face 144 likewise desirably forms an angle $\gamma$ with the plane of the side wall 44 of between 10 and 80 degrees when the latch 126 is in the first position illustrated in FIG. 3. More desirably, the angle is $\gamma$ is between 15 and 30 degrees. Preferably, the angle $\gamma$ is 25 degrees. The front and rear locking surfaces 150, 152 preferably are disposed generally perpendicularly to the side wall 44 when the latch is in the first position.

With reference to FIGS. 1 and 3, the slide assembly 12 of the illustrated embodiment is of the quick disconnect variety; however, the present invention may also be utilized in a non-disconnecting slide assembly. In the depicted embodiment, the inner slide segment 16 can be entirely removed from the channel 56 of the intermediate slide segment 18 to allow convenient removal of the computer server from the server rack for repair or replacement of the computer server. To replace the computer server in the server rack, the rear end of the inner slide segment 16 must be guided back into the channel 56 of the intermediate slide segment 18.

The distance between the inner bearing surfaces 46 of the intermediate slide segment 18 is necessarily greater than the height of the of the inner slide segment 16 in order to accommodate the ball bearings 86. As a result, the inner slide segment 16 can become misaligned in the channel 56. When the inner slide segment 16 is misaligned, the end of the inner slide segment 16 can interfere with the bearing assembly 80.

Because the ball bearings 86 roll along the bearing surfaces 68 of the inner slide segment 16 and the inner bearing surfaces 46 of the intermediate slide segment 18, the bearing assembly 80 follows the inner slide segment 16 as the inner slide segment 16 is moved rearwardly in the channel 56. When the bearing assembly 80 abuts the rear stop 106, further rearward movement of the bearing assembly 80 is prevented. As a result, the ball bearings 86 are prevented from rolling along the inner bearing surfaces 46 of the intermediate slide segment 18. This makes further rearward movement of the inner slide segment 16 more frictional because the inner bearing are inserted against stationary bearings. In addition to being inconvenient, damage to the bearing assembly 80 or other components of the slide assembly 12 can result if the inner slide segment 16 is forcibly retracted.

One embodiment of the latch 126 serves to retain the bearing assembly 80 near the forward end of the channel 56. When the latch 126 is in the first position illustrated in FIG. 3, the locking portion 140 extends into the channel 56 beyond the side portion 96 of the bearing retainer 84. The cross-member 98 is captured between the front locking surface 150 and the rear locking surface 152. Rearward movement of the bearing assembly 80 is limited by the rear locking surface 152. Forward movement of the bearing assembly 80 is limited by the front locking surface 150 and/or the hard stops 154. With the bearing assembly 80 retained near the front of the channel 56, it is easier to guide the forward end of the inner slide segment 16 past the forward end of the bearing assembly 80 as the inner slide segment is inserted into the channel 56.

Figure 7:
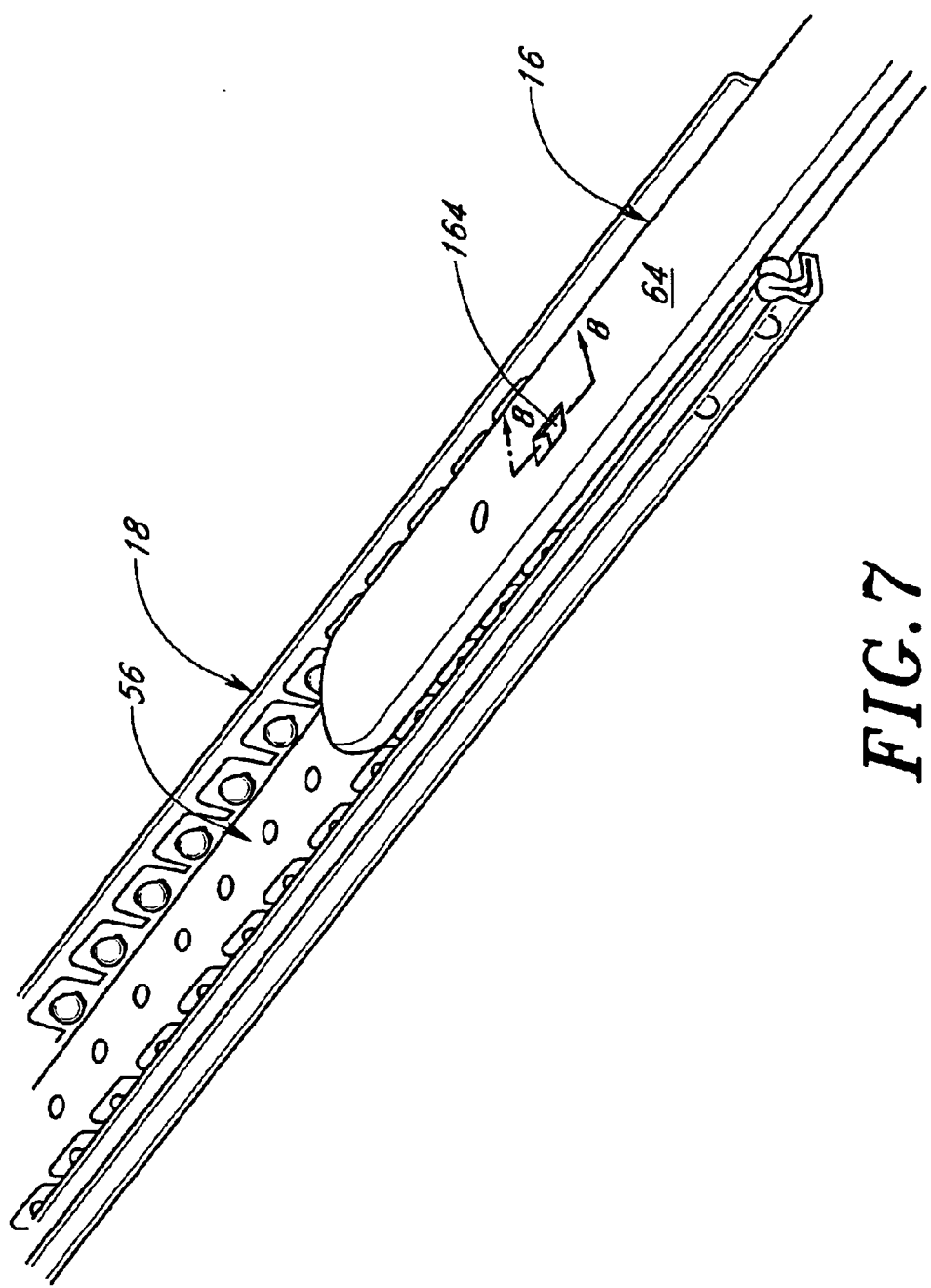
FIG. 7 is a perspective view of a portion of the inner slide segment and a portion of the intermediate slide segment of the slide assembly of FIG. 1, showing the tab on the inner slide segment.
Figure 8:
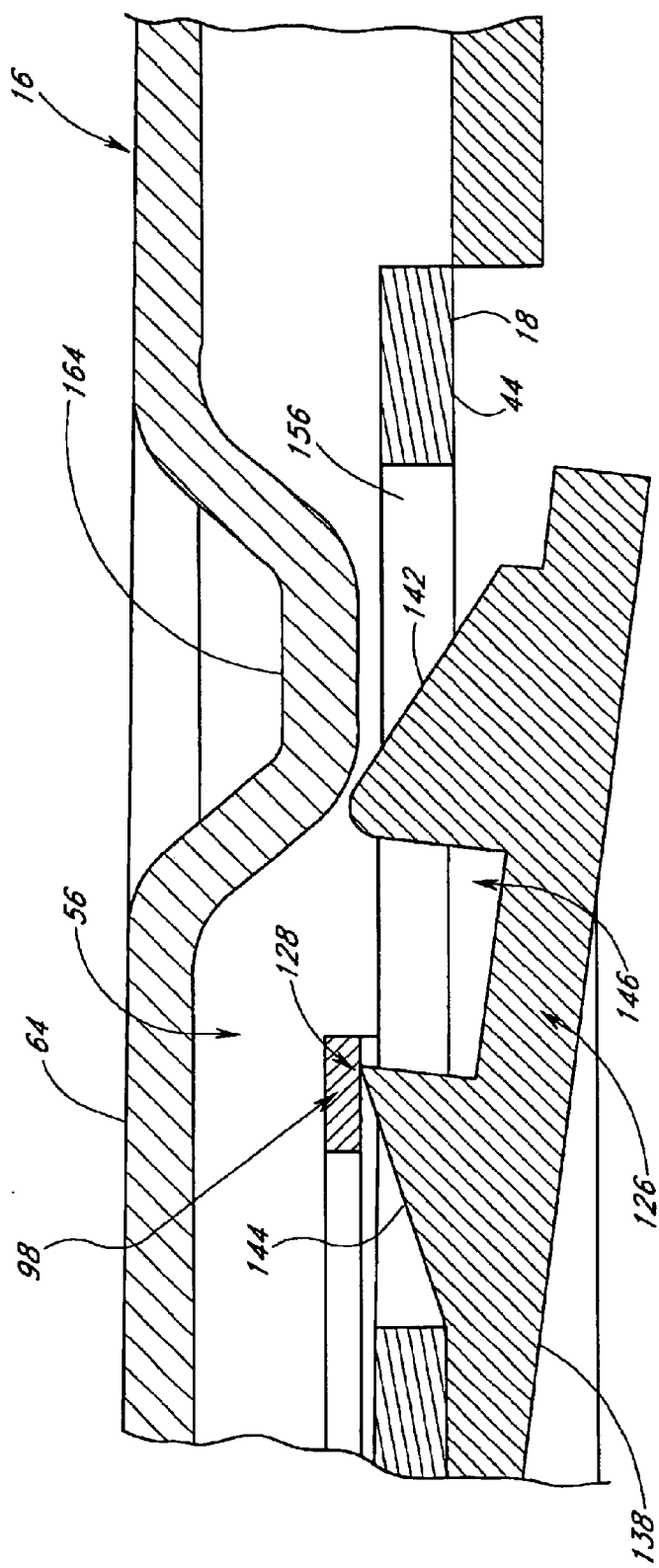
FIG. 8 is a cross-sectional view of a portion of the inner slide segment and a portion of the intermediate slide segment of the slide assembly of FIG. 1, taken along the line 8—8 of FIG. 7.
Figure 9:
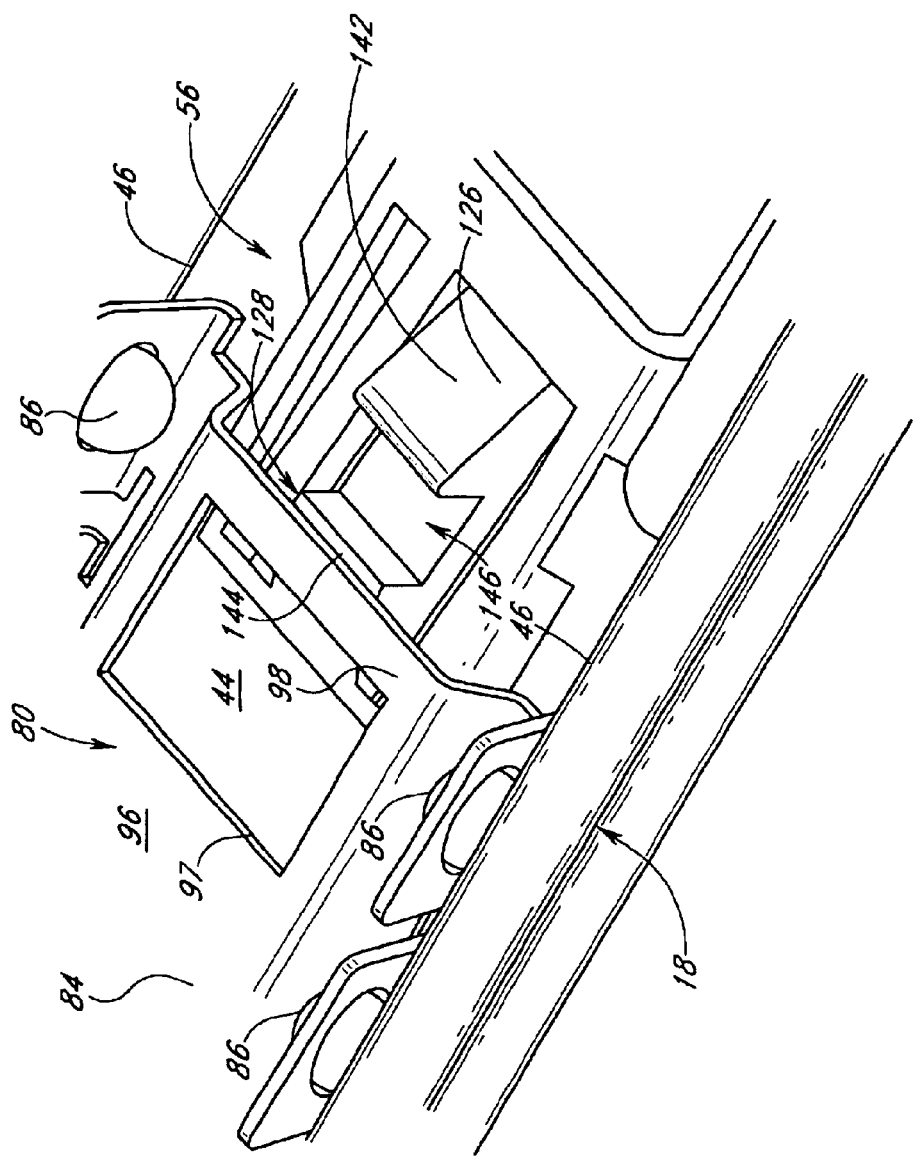
FIG. 9 is a perspective view of a portion of the intermediate slide assembly of the slide assembly of FIG. 1, with the latch shown in a second position.

Referring now to FIG. 7, a tab 164 is provided on the side wall 64 of the inner slide segment 16. In the illustrated embodiment, the tab 164 comprises an indentation on the side wall 64 that extends into the channel 56 of the intermediate slide segment 18. When the inner slide segment 16 is inserted and moved rearwardly in the channel 56, the tab 164 contacts the front face 142 of the latch 126, as illustrated in FIG. 8. This causes the secondary arm 138 to flex away from the side wall 44 of the intermediate slide segment 18. In this second latch position, illustrated in FIGS. 8 and 9, the locking portion 140 does not extend into the opening 97 in the side portion 96 of the bearing retainer 84. The bearing assembly 80 is therefore free to move in the channel 56 with the inner slide segment 16.

As the inner slide segment 16 is moved forwardly in the channel 56, the bearing assembly 80 is moved towards the latch 126. When the inner slide segment 16 is removed from the channel 56, the cross-member 98 of the bearing retainer 84 contacts the rear face 144 of the latch 126, causing the latch 126 to move to the second latch position, wherein the secondary arm 138 is flexed away from the side wall 44 of the intermediate slide segment 18. The cross-member 98 rides over the rear face 144 of the latch 126 and into the recess 146 to lock the bearing assembly 80 in place again.

One advantage of the slide assembly 12 of the present embodiment is that it does not require a separate manual operation to lock or unlock the bearing assembly 80. As the inner slide segment 16 is inserted in the channel, the tab 164 contacts the locking portion 140 of the latch 126 to automatically free the bearing assembly 80. When the inner slide segment 16 is removed from the channel 56, the bearing assembly 80 is drawn forwardly towards the latch 126. The cross-member 98 of the bearing retainer 84 contacts the locking portion 140 of the latch 126 and the bearing assembly 80 is automatically locked in place.

Figure 10:
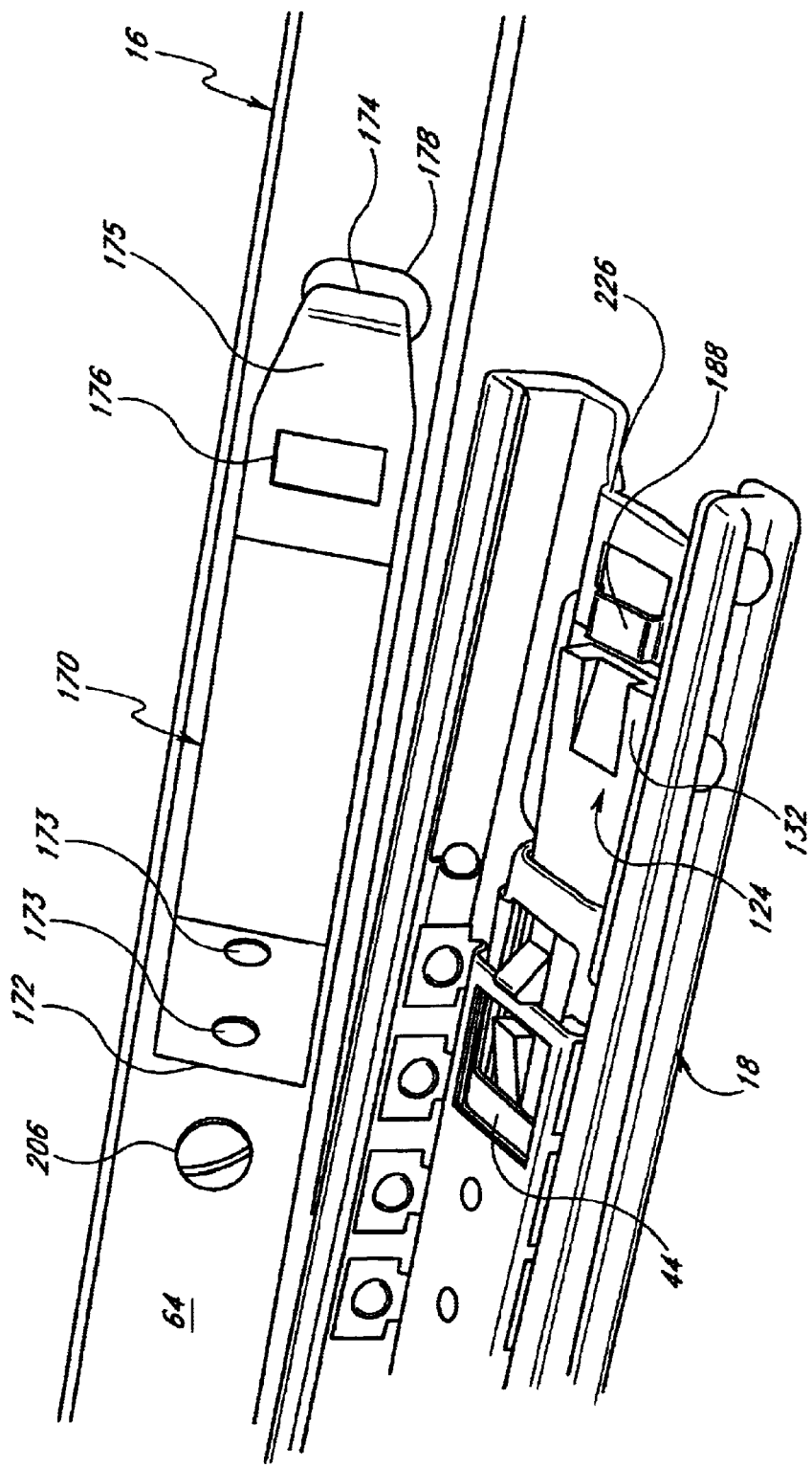
FIG. 10 is a perspective view of a portion of the inner slide segment and a portion of the intermediate slide segment of the slide assembly of FIG. 1, with the inner slide segment detached from the intermediate slide segment.

With reference now to FIG. 10, a lock arm 170 is provided on an inner surface of the side wall 64 of the inner slide segment 16. In the illustrated embodiment, the lock arm 170 comprises a thin, planar steel strip that is attached at a first end 172 to the inner surface of the side wall 64. The first end 172 of the lock arm 170 preferably is attached to the side wall 64 by a pair of tabs (not shown) that extend from the side wall 64 through a pair of openings 173 in the lock arm 172. The lock arm 170 is bent slightly away from the side wall 64 and extends forwardly and outwardly from the side wall 64 from the first end 172. A second end 174 of the lock arm 170 is bent inwardly towards the side wall 64. The bent portion of the lock arm 170 is referred to as a lip 175. An opening or window 176 is provided in the lock arm near the second end 174.

The lock arm 170 desirably can be flexed inwardly towards the side wall 64 of the inner slide segment 16, and then resiliently returns to its original position. An opening 178 is provided in the side wall 64 of the inner slide segment 16 adjacent the second end 174 of the lock arm 170. When the lock arm 170 is fully flexed towards the side wall 64, the second end 174 of the lock arm 170 extends into the opening 178.

Referring still to FIG. 10, the intermediate slide segment 18 includes an engagement surface 188. In the illustrated embodiment, the engagement surface 188 comprises a bridge-like structure located immediately forward of the end portion 132 of the actuator 124. The engagement surface 188 desirably is slightly raised relative to the side wall 44 of the intermediate slide segment 18.

Figure 11:
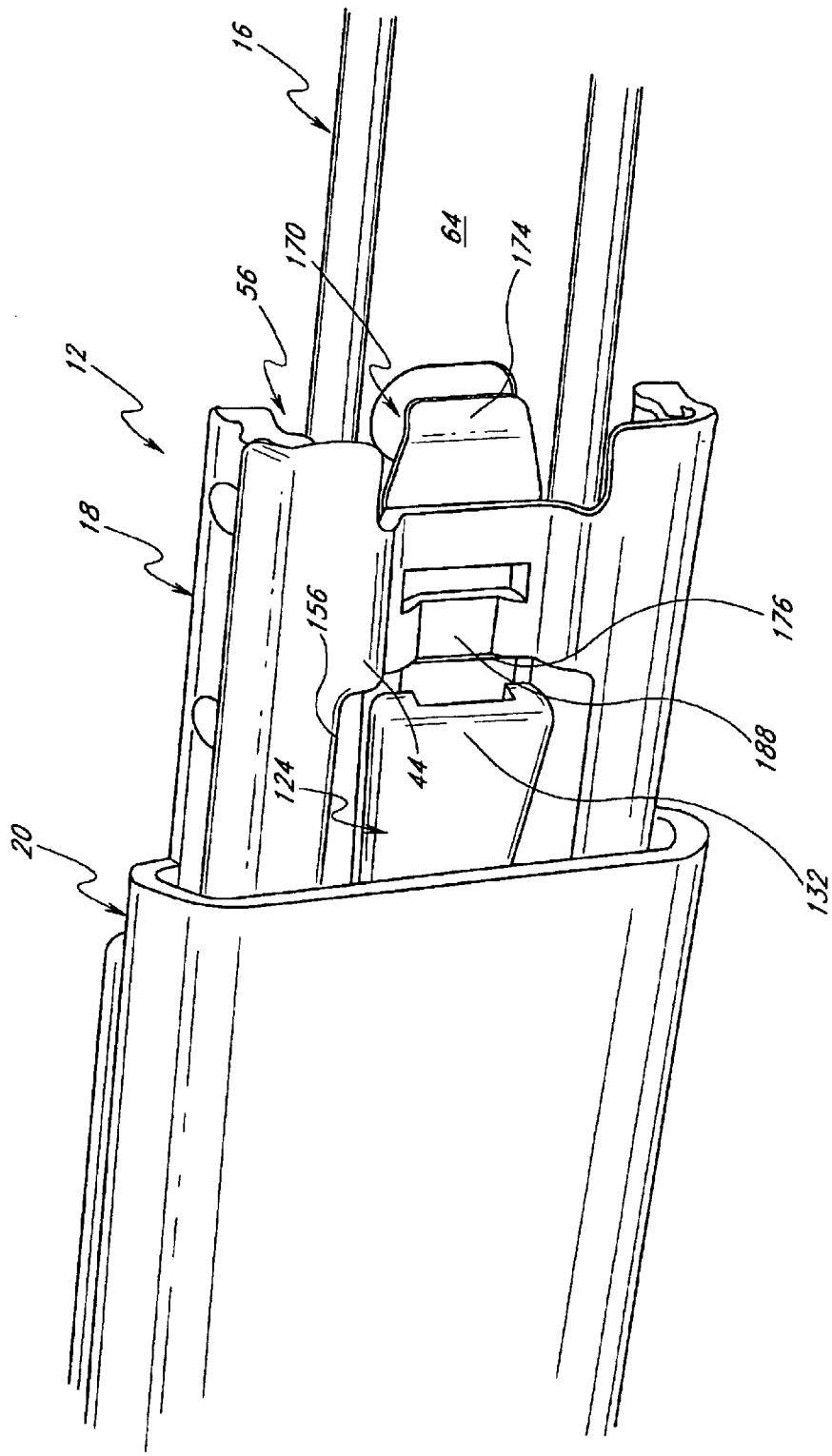
FIG. 11 is a perspective view of a portion of the inner slide segment and the forward ends of the intermediate slide segment and outer slide segment of the slide assembly of FIG. 1, with the lock arm of the inner slide segment engaging the engagement surface of the intermediate slide segment.

With reference now to FIGS. 10 and 11, the shape of the window 176 in the lock arm 170 generally corresponds to the shape of the engagement surface 188. The lock arm 170 is biased towards the side wall 44 of the intermediate slide segment 18 so that, when the inner slide segment 16 is fully extended with respect to the intermediate slide segment 18, as illustrated in FIG. 11, the engagement surface 188 is caught in the opening 176 of the lock arm 170. As a result, further movement of the inner slide segment 16 with respect to the intermediate slide segment 18 is prevented.

According to one embodiment, to remove the inner slide segment 16 from the channel 56 of the intermediate slide segment 18, the second end 174 of the lock arm 170 must be moved towards the side wall 64 of the inner slide segment 16, preferably by manually pressing the actuator 124 towards the lock arm 170. This prevents the inner slide segment 16, and the attached computer server, from unintentionally being detached from the rest of the slide assembly 12 and possibly causing damage to the server. By moving the second end 174 of the lock arm 170 towards the side wail 64, the lock arm 170 is released from the engagement surface 188, and the inner slide segment 16 can then be removed from the channel 56. Thus, in the illustrated embodiment, the lock arm 170, engagement surface 188 and actuator 124 comprise a removal mechanism. Of course, the described disconnect feature is not essential to all the embodiments described herein and is merely representative of one feature of some of the embodiments disclosed herein.

Figure 12:
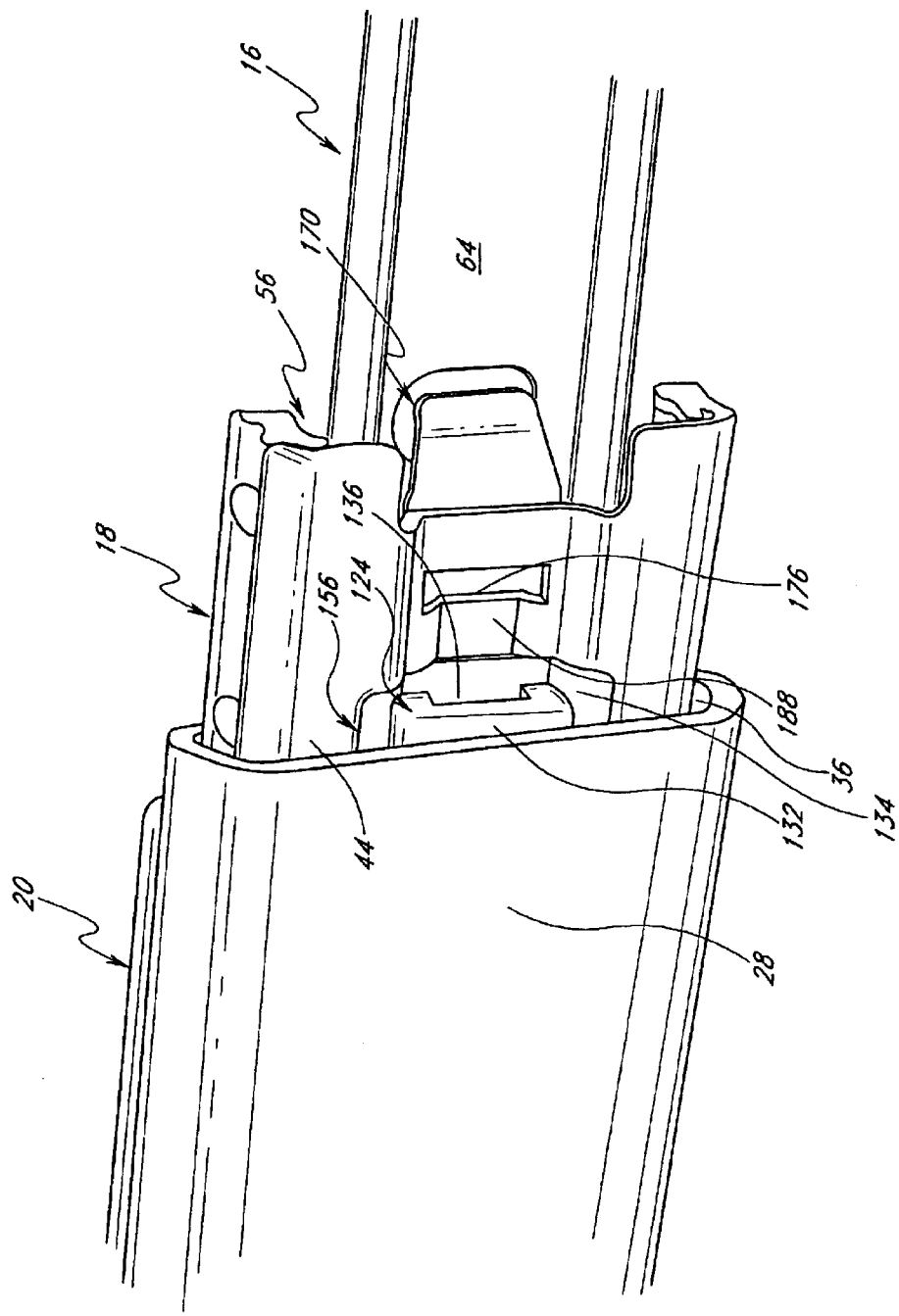
FIG. 12 is a perspective view of a portion of the inner slide segment and the forward ends of the intermediate slide segment and outer slide segment of the slide assembly of FIG. 1, with the lock arm of the inner slide segment disengaged from the engagement surface of the intermediate slide segment.

The actuator 124 serves to automatically release the lock arm 170 from the engagement surface 188 when the slide assembly 12 is retracted. As illustrated in FIG. 11, when the intermediate slide segment 18 is extended slightly with respect to the outer slide segment 20, the lock arm 170 is allowed to engage the engagement surface 188. However, when the intermediate slide segment 18 is retracted into the channel 36 of the outer slide segment 20, as illustrated in FIG. 12, the side wall 28 of the outer slide segment 20 contacts the end portion 132 of the actuator 124. The end portion 132 of the actuator 124, in turn, extends through the opening 156 in the side wall 44 of the intermediate slide segment 18 to press the lock arm 170 towards the side wall 64 of the inner slide segment 16. This releases the lock arm 170 from the engagement surface 188 and allows the inner slide segment 16 to be retracted into the channel 56 of the intermediate slide segment 18.

Because the end portion 132 of the actuator 124 is wider than the opening 176 in the lock arm 170, the end portion 132 is not caught in the opening 176 as the inner slide segment 16 is retracted. The groove 136 formed in the center of the end portion 132 allows for the passage of any fasteners 206 (see FIG. 10) that may extend through the side wall 64 of the inner slide segment to attach to the computer server to the inner slide segment 16. This prevents the fasteners 196 from interfering with the end portion 132 of the actuator as the inner slide segment 16 is moved into and out of the channel 56.

Figure 13:
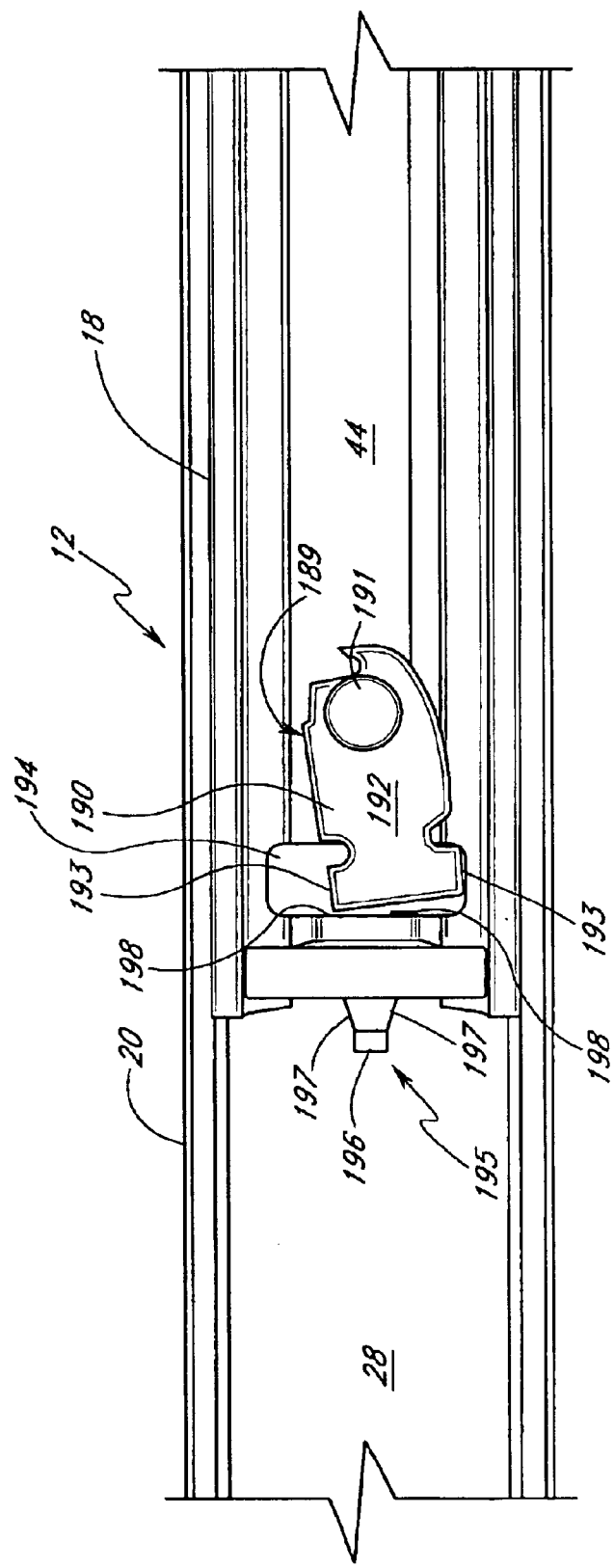
FIG. 13 is a perspective view of a portion of the outer slide segment and the rear end of the intermediate slide segment of the slide assembly of FIG. 1, with the pivot arm of the intermediate slide segment in abutting engagement with the stop surface of the stop member of the outer slide segment.

With reference to FIG. 13, the slide assembly 12 desirably also includes a lock 189 for locking the intermediate slide segment 18 in an extended position with respect to the outer slide segment 20. In the illustrated embodiment, the lock 189 comprises a pivot arm 190 that is pivotally attached by a rivet 191 or other suitable means to the side wall 44 of the intermediate slide segment 18. The pivot arm 190 comprises a generally planar main portion 192 and a pair of fingers 193 that extend towards the side wall 28 of the outer slide segment 20 through an opening 194 provided in the side wall 44 of the intermediate slide segment 18.

Figure 14:
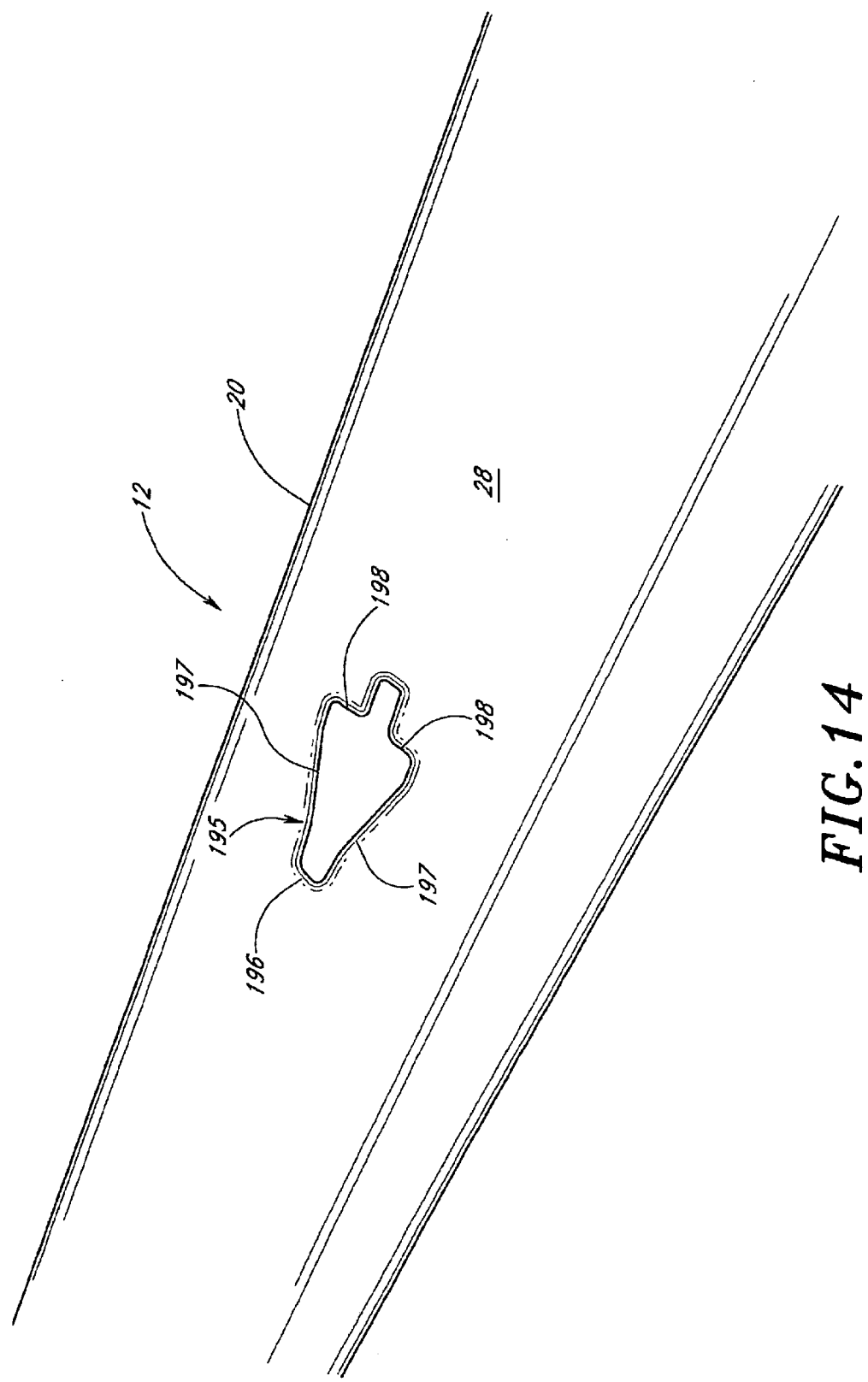
FIG. 14 is a perspective view of a portion of the back side of the outer slide segment of the slide assembly of FIG. 1 illustrating the stop member.

With reference to FIGS. 13 and 14, a stop member 195 desirably protrudes from the side wall 28 of the outer slide segment 20 towards the intermediate slide segment 18. In the illustrated embodiment, the stop member 195 is generally arrow-shaped, having a tip 196, a pair of diverging sides 197, and a pair of stop surfaces 198 that extend generally perpendicularly to a longitudinal axis of the slide assembly 12.

When the intermediate slide segment 18 is retracted with respect to the outer slide segment 20, and the inner slide segment 16 is extended or removed from the channel 56 of the intermediate slide segment 18, the pivot arm 190 is caused by gravity to reside near a bottom surface of the side wall 44. As the intermediate slide segment 18 is extended with respect to the outer slide segment 20, the pivot arm 190 meets the stop member 195 protruding from the side wall 28 of the outer slide segment 20. The upper finger 193 of the pivot arm 190 rides over the upwardly sloping side 197 of the stop member 195, then drops into abutting engagement with the upper stop surface 198. This prevents retraction of the intermediate slide segment 18 with respect to the outer slide segment 20. While descriptive of a typical locking engagement, other configurations are entirely possible and are contemplated herein.

Figure 15:
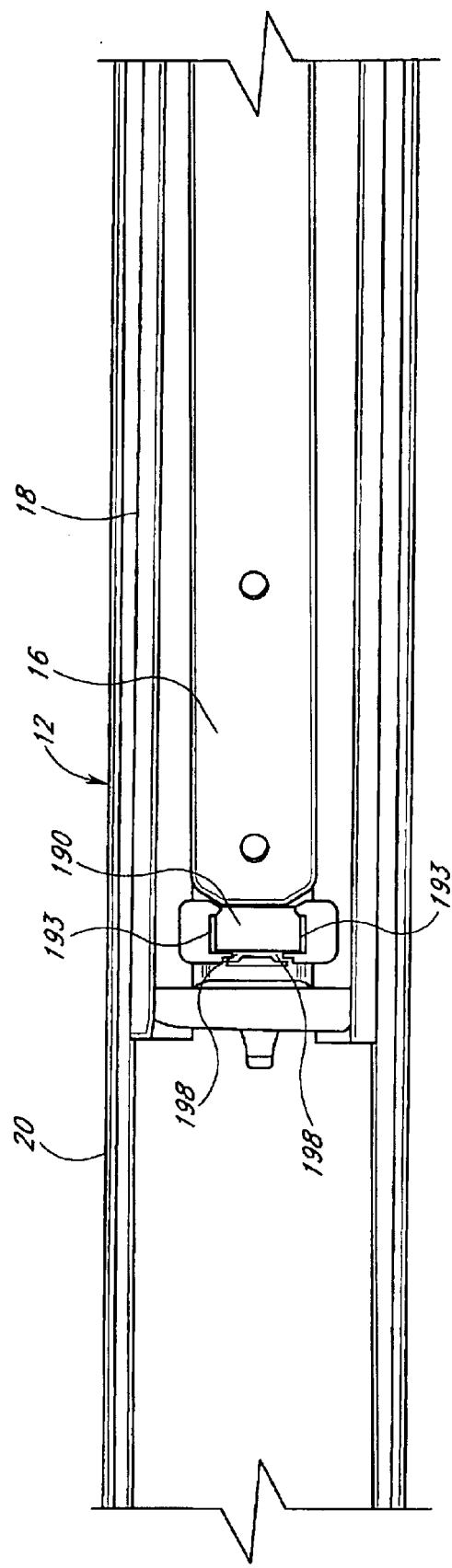
FIG. 15 is a perspective view of a portion of the outer slide segment and the rear ends of the inner and intermediate slide segments of the slide assembly of FIG. 1, with the pivot arm disengaged from the stop surface of the stop member.

To release the pivot arm 190, the inner slide segment 16 is retracted with respect to the intermediate slide segment 18, as illustrated in FIG. 15. As the inner slide segment 16 is retracted, the rear end of the inner slide segment 16 slides over the pivot arm 190 and lifts the pivot arm 190 so that the upper finger 193 is raised above the upper stop surface 198. This releases the pivot arm 190 and allows the intermediate slide segment 18 to be retracted with respect to the outer slide segment 20.

As discussed above, in embodiments employing quick disconnect slide assemblies, the inner slide segment is removable from the rest of the slide assembly to allow the attached computer server to be repaired or replaced. When the inner slide segment is first installed or reinstalled in the server rack, it is inconvenient to have to actuate a lock in order to retract the inner slide segment. Accordingly, in the presently described embodiment, to install the computer server in the server rack, the intermediate slide segment 18 is first fully retracted into the outer slide segment 20. The inner slide segment 16 is then inserted into the channel 56 of the intermediate slide segment 18 and retracted. Because the intermediate slide segment 18 is retracted with respect to the outer slide segment 20, the side wall 28 of the outer slide segment 20 pushes the end portion 132 of the actuator 124 through the opening 156 in side wall 44 of the intermediate slide segment 18. As the inner slide segment 16 is retracted, the end portion 132 of the actuator 124 contacts the lock arm 170 to prevent the lock arm from engaging the engagement surface 188 of the intermediate slide segment 18. Thus, the inner slide segment 16 and attached computer server can be installed and fully retracted in a single motion, without having to manually actuate the lock arm 170 of the inner slide segment 16.

Figure 16:
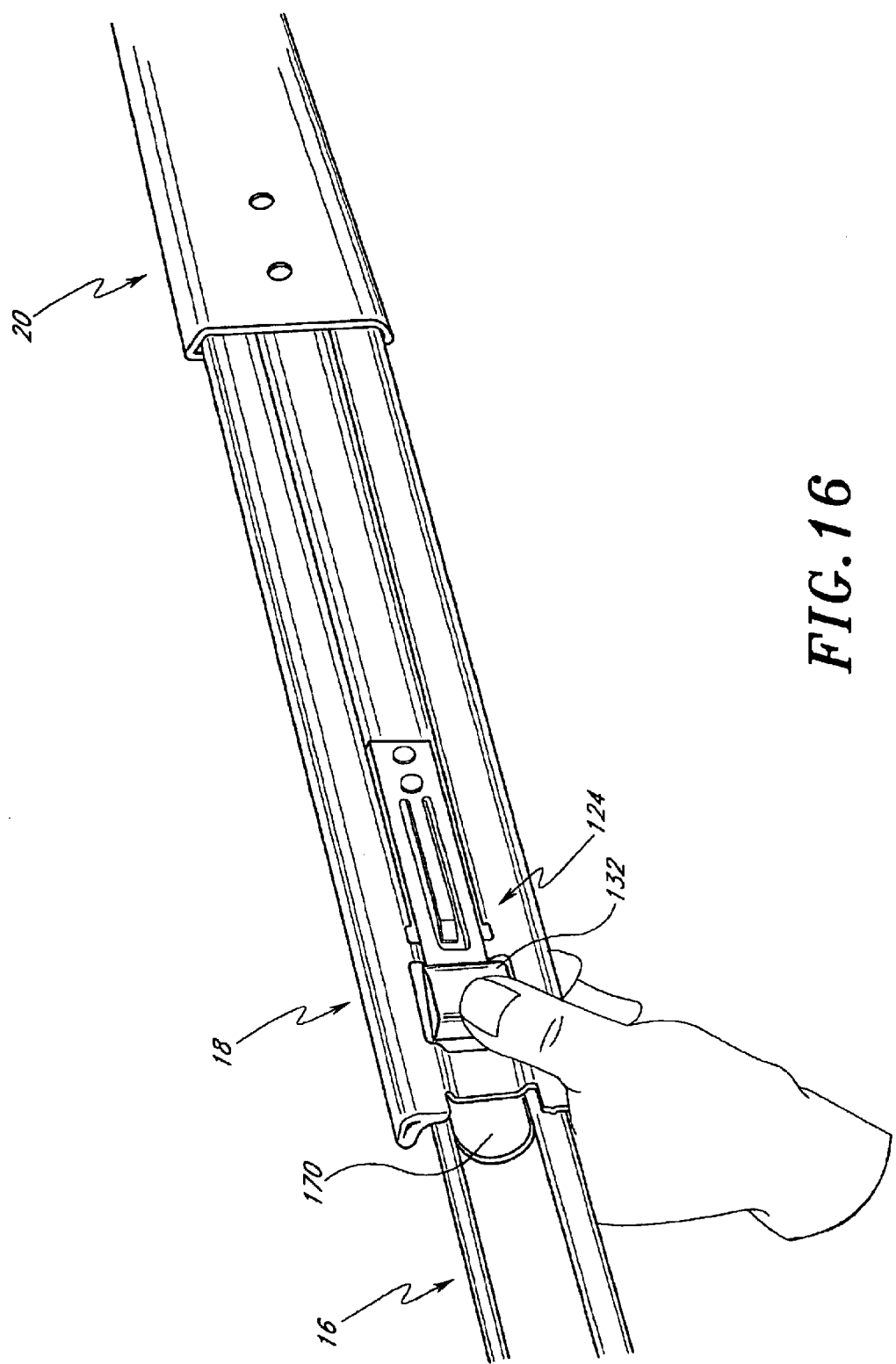
FIG. 16 is a perspective view of a portion of the back side of the slide assembly of FIG. 1, illustrating the manual actuation of the actuator.
Figure 17:
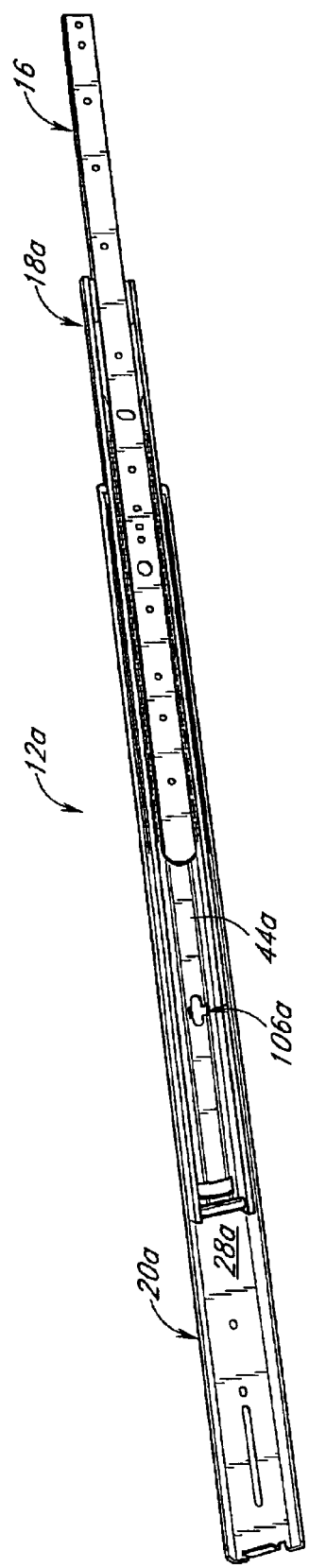
FIG. 17 is a perspective view of an alternative embodiment of the slide assembly.

Once installed, the slide assembly 12 can be extended to access the computer server. When the slide assembly 12 is fully extended, the inner slide segment 16 is locked with respect to the intermediate slide segment 18, and the intermediate slide segment 18 is locked with respect to the outer slide segment 20. To retract the slide assembly 12 again, the end portion 132 of the actuator 124 may be manually pressed, as illustrated in FIG. 16, to release the lock arm 170 from the engagement surface 188 and thereby allow the inner slide segment 16 to be retracted into the intermediate slide segment 18. Because the lock arm 170 can be released by pressing the actuator 124 instead of the lock arm 170 itself, there is little risk that the fingers of the operator will get pinched between the lock arm 170 and the intermediate slide segment 18 as the lock arm 170 is disengaged and the inner slide segment 16 is retracted. As will be described later, a front lock release mechanism may also be employed to release the inner slide segment 16. When the inner slide segment 16 is retracted, the rearward end of the inner slide segment 16 actuates the lock 189 of the intermediate slide segment 18 to allow the intermediate slide segment 18 to be retracted with respect to the outer slide segment 20.

Figure 18:
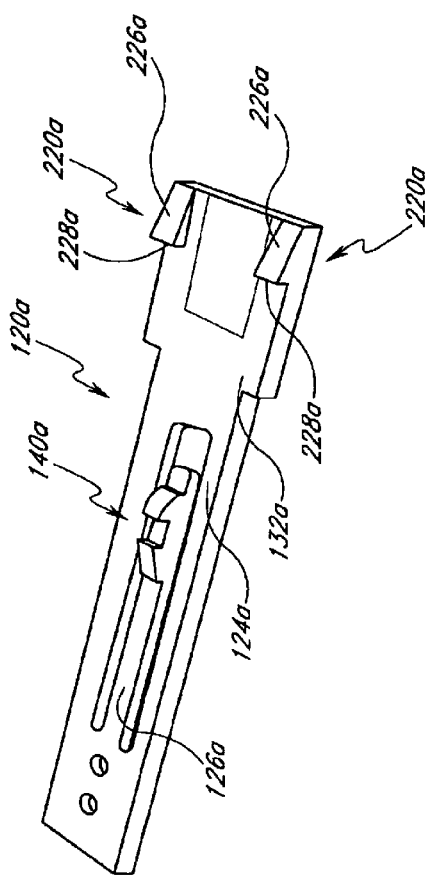
FIG. 18 is a perspective view of the front side of the controller of the slide assembly of FIG. 17.
Figure 19:
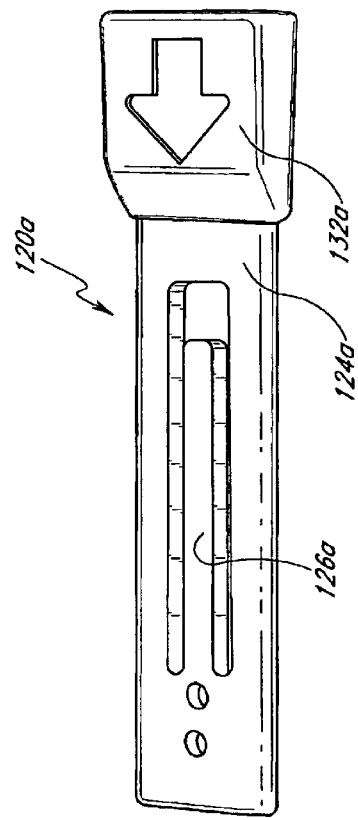
FIG. 19 is a perspective view of the back side of the controller of the slide assembly of FIG. 17.
Figure 20:
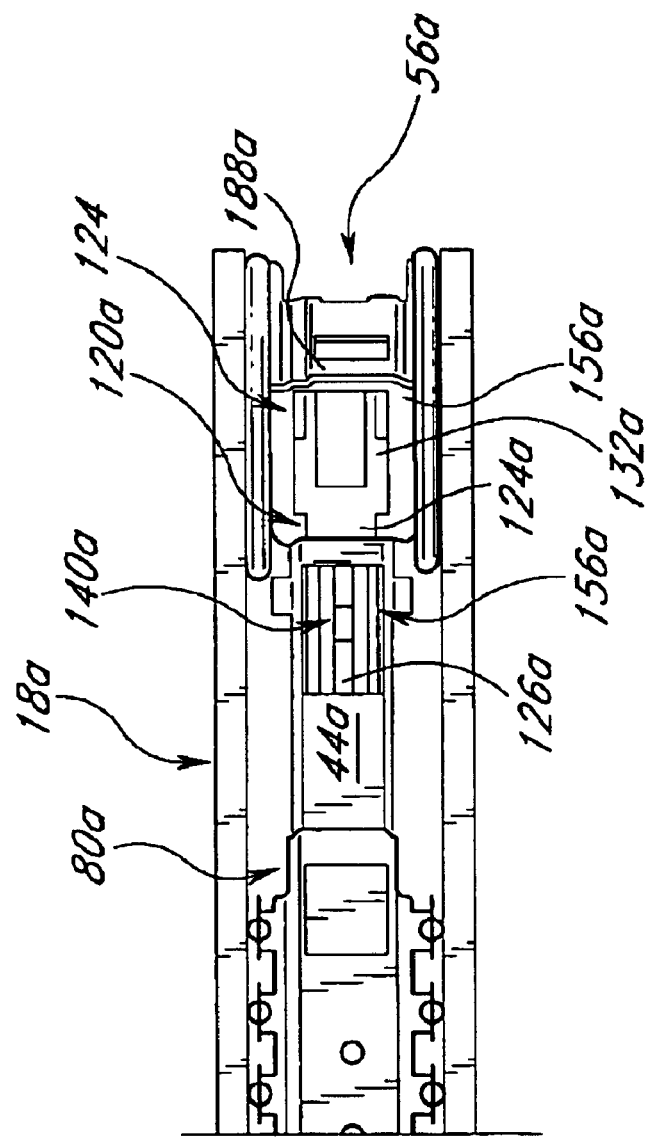
FIG. 20 is an elevational view of a forward end of the intermediate slide segment of the slide assembly of FIG. 17.

With reference now to FIGS. 17–21, an alternative embodiment of the slide assembly is illustrated. The controller 120a of the alternative embodiment is illustrated in FIGS. 18 and 19. As can be seen from FIGS. 18 and 19, the controller 120a is similar to the controller 120 of the previous embodiment, but includes a pair of catches 220a that extend from the end portion 132a of the actuator 124a. Each of the catches 220a preferably has a generally planar sloping front surface 226a and a generally planar catch surface 228a. Like the controller 120 of the previous embodiment, the controller 120a is attached to the side wall 44a of the intermediate slide segment 18a so that the end portion 132a of the actuator 124a and the locking portion 140a of the latch 126a extend through the openings 156a in the side wall 44a, as illustrated in FIG. 20.

Figure 21:
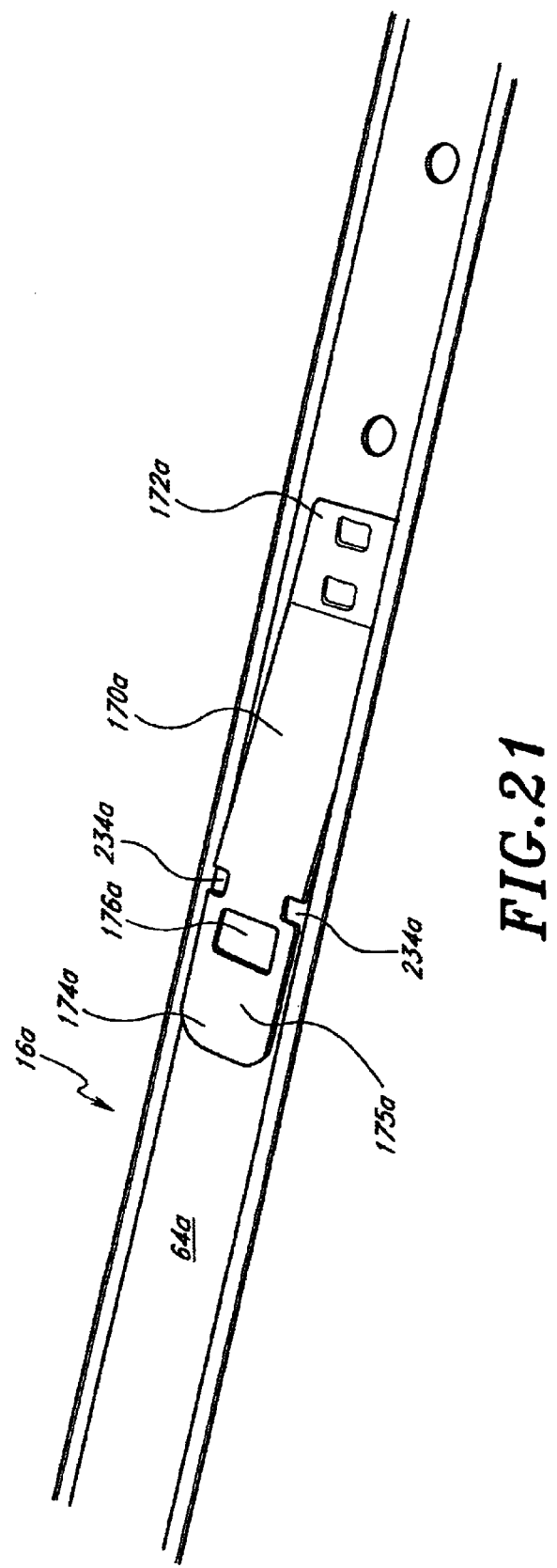
FIG. 21 is a perspective view of a portion of the inner slide segment and lock arm of the slide assembly of FIG. 17.

With reference now to FIG. 21, the inner slide segment 16a of the slide assembly 12a is shown. As in the previous embodiment, the inner slide segment 16a includes a lock arm 170a. The lock arm 170a is attached at a first end 172a to the inner surface of the side wall 64a of the inner slide segment 16a. An opening 176a is provided in the lock arm 170a near the second end 174a thereof. A pair of notches 234a desirably are provided in the upper and lower sides of the lock arm 170a just rearwardly of the opening 176a.

The latch 126a of the controller 120a operates in the same manner as in the previous embodiment to retain the bearing assembly 80a near the forward end of the channel 56a. The actuator 124a of the controller 120a likewise operates in a manner similar to that of the previous embodiment. Thus, in the alternative embodiment of FIGS. 17–21, to install the computer server in the server rack, the intermediate slide segment 18a is first fully retracted into the outer slide segment 20a. The side wall 28a of the outer slide segment 20a pushes the end portion 132a of the actuator 124a through the opening 156a in side wall 44a of the intermediate slide segment 18a. The inner slide segment 16a is then inserted into the channel 56a of the intermediate slide segment 18a and retracted. As the inner slide segment 16a is retracted, the end portion 132a of the actuator 124a contacts the lock arm 170a to prevent the lock arm 170a from engaging the engagement surface 188a of the intermediate slide segment 18a. Although the controllers 120, 120a of the illustrated embodiments advantageously combine the functions of both the actuator and the latch, it will be apparent to those skilled in the art that the actuator and the latch can each be used be used separately in a slide assembly.

In the slide assembly 12 of the previous embodiment, the lock arm 170 does not engage the engagement surface 188 when the intermediate slide segment 18 is retracted in the outer slide segment 20 because the side wall 28 of the outer slide segment 20 pushes the end portion 132 of the actuator 124 through the opening 156 in the side wall 44 of the intermediate slide segment 18. As a result, there is a possibility that, when the slide assembly 12 is extended, the inner slide segment 16 can be entirely removed from the intermediate slide segment 18 before the intermediate slide segment 18 is extended with respect to the outer slide segment 20. If the inner slide segment 16 is extended before the intermediate slide segment 18, the lock arm 170 will not engage the engagement surface 188. The inner slide segment 16 and attached computer server may, therefore, be unintentionally detached from the rest of the slide assembly 12.

In the slide assembly 12a of FIGS. 17–21, when the intermediate slide segment 18a is retracted with respect to the outer slide segment 20a, the side wall 28a of the outer slide segment 20a contacts the end portion 132a of the actuator 124a. As in the previous embodiment, the end portion 132a of the actuator 124a extends through the opening 156a in the intermediate slide segment 18a and contacts the lock arm 170a so that the lock arm is unable to engage the engagement surface 188a of the intermediate slide segment 18a. In the slide assembly 12a of FIGS. 17–21, however, as the inner slide segment 16a is extended, the catch surfaces 228a of the catches 220a at the end portion 132a of the actuator 124a engage the notches 234a at the sides of the lock arm 170a to draw the intermediate slide segment 18a out of the outer slide segment 20a as the inner slide segment 16a is extended. When the intermediate slide segment 18a is extended from the outer slide segment 20a sufficiently that the side wall 28a of the outer slide segment 20a no longer contacts the end portion 132a of the actuator 124a, the actuator 124a resiliently returns to position and the catches 220a are disengaged from the notches 234a of the lock arm 170a. The inner slide segment 16a can then be extended further with respect to the intermediate slide segment 18a until the opening 176a in the lock arm 170a engages the engagement surface 188a of the intermediate slide segment 18a to lock the inner slide segment 16a with respect to the intermediate slide segment 18a.

Since the catches 220a at the end portion 132a of the actuator 124a cooperate with the notches 234a in the lock arm 170a to draw the intermediate slide segment 18a out of the outer slide segment 20a, there is no danger that the inner slide segment 16a will be entirely removed from the intermediate slide segment 18a before the intermediate slide segment 18a is extended with respect to the outer slide segment 20a. The catches 220a at the end portion 132a of the actuator 124a cooperate with the notches 234a in the lock arm 170a to prevent the unintentional detachment of the inner slide segment 16a and attached computer server from the rest of the slide assembly 12a.

To retract the slide assembly 12a again, the end portion 132a of the actuator 124a may be manually pressed to release the lock arm 170a from the engagement surface 188a and thereby allow the inner slide segment 16a to be retracted into the intermediate slide segment 18a. Alternatively, the front release mechanism described later in detail may be actuated to retract the slide assembly 12a. As in the previous embodiment, because the lock arm 170a of the inner slide segment 16a can be released by pressing the actuator 124a instead of the lock arm 170a itself, there is no risk that the fingers of the operator will get pinched between the lock arm 170a and the intermediate slide segment 18a as the lock arm 170a is disengaged and the inner slide segment 16a is retracted. When the inner slide segment 16a is retracted, the forward end of the inner slide segment 16a actuates the lock (not shown) of the intermediate slide segment 18a to allow the intermediate slide segment 18a to be retracted with respect to the outer slide segment 20a.

As an alternative to the described catch surfaces 228a engaging the notches 234a of the lock arm to prevent unintentional disassembly of the inner slide segment 16a from the intermediate slide segment 18a, a preferential sequencing mechanism could be substituted, as is known in the art.

Thus, the described embodiments provide a controller for a quick disconnect slide assembly that positively locks the inner slide segment when fully extended and provides a release to remove the inner slide segment from the intermediate slide segment when desired.

In addition to the controller 120 described, FIGS. 22A, B, and C illustrate an embodiment of an elongated release member 200 that functions independently of the controller 120 to release the inner slide segment 16 for retraction into the intermediate slide segment 18. It should be noted that the described elongated release member 200 functions independently of the controller 120; however, the two devices can co-exist in the same slide assembly or may be incorporated separately into various slide assembly embodiments. The elongated release member 200 is advantageously formed of a polymeric material having a low coefficient of friction such that it can easily slide within the inner slide segment channel 56, such as polyethylene, polypropylene, or acetyl. As shown in FIG. 2, inner slide segment channel 56 is formed by upper wall 60, lower wall 62, and an interconnecting side wall 64. Because the upper and lower walls 60, 62 are concave outward with respect to the channel 56, the release member 200 has edges 202 that are beveled to allow the release member 200 to be slidably captured within the channel 56.

The release member 200 further has a bottom sliding surface 206 having a longitudinal groove 204 formed therein that spans the length of the release member 200 to allow the release member 200 to slidably pass over fasteners, such as rivets or screws, that may be mounted through the inner slide segment side wall 64. A front edge 208 of the slide member 200 is chamfered such that a top surface 210 is longer than the bottom surface 206 and will be discussed later in detail. The top surface has a lanced out stop tab 212 molded therein, although the stop tab 212 could be formed by bending the material. The stop tab 212 cooperates with a hole formed in the inner slide segment side wall 64 to be discussed in greater detail hereinafter. Release member 200 is further configured with a flange 214 that provides a push surface 216 having an increased surface area to receive an actuating force, and a reset surface 218.

During initial assembly, the release member 200 is inserted into the inner slide segment channel 56. The draft angle of the sidewalls 202 and the correspondingly shaped inner slide segment upper and lower walls 60, 62 maintain the slide segment 200 in sliding engagement with the inner slide segment 16 and disallow removal except by sliding.

Figure 23:
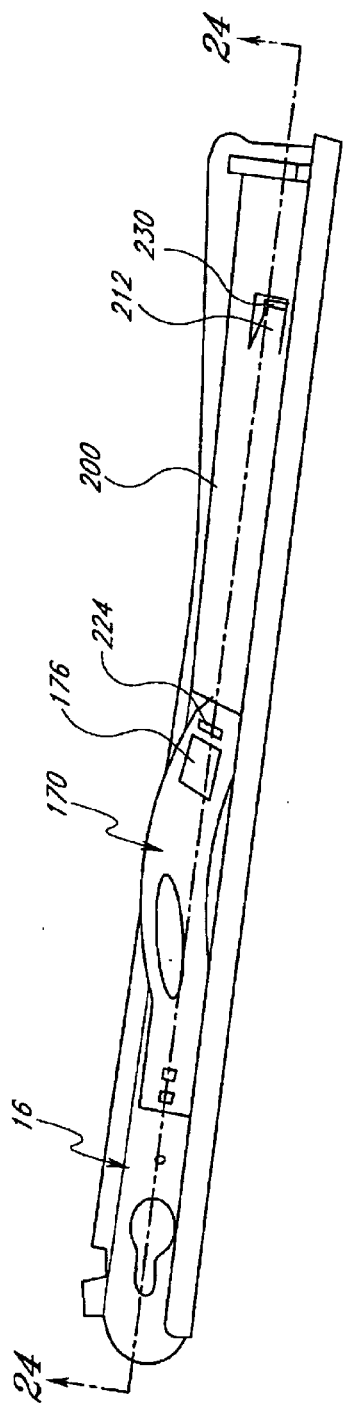
FIG. 23 is a perspective view of the inner slide segment showing the interaction of the lock arm and elongated release member.
Figure 24:
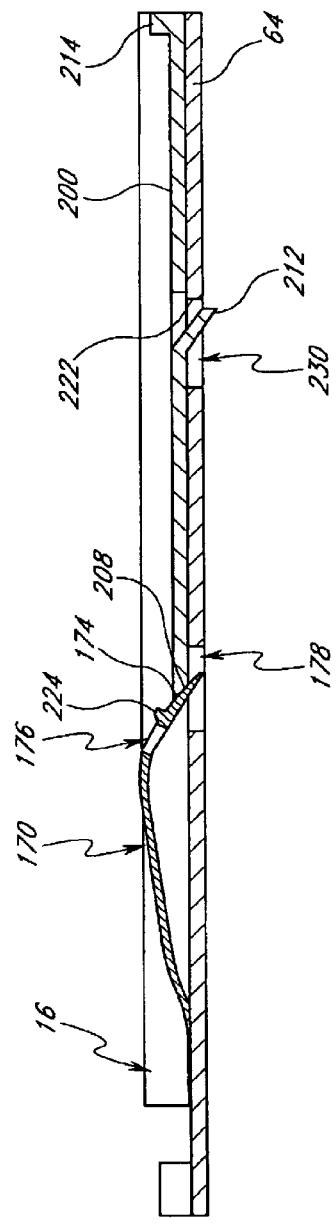
FIG. 24 is a sectional view of the inner slide segment taken along line 24—24 of FIG. 23.
Figure 25:
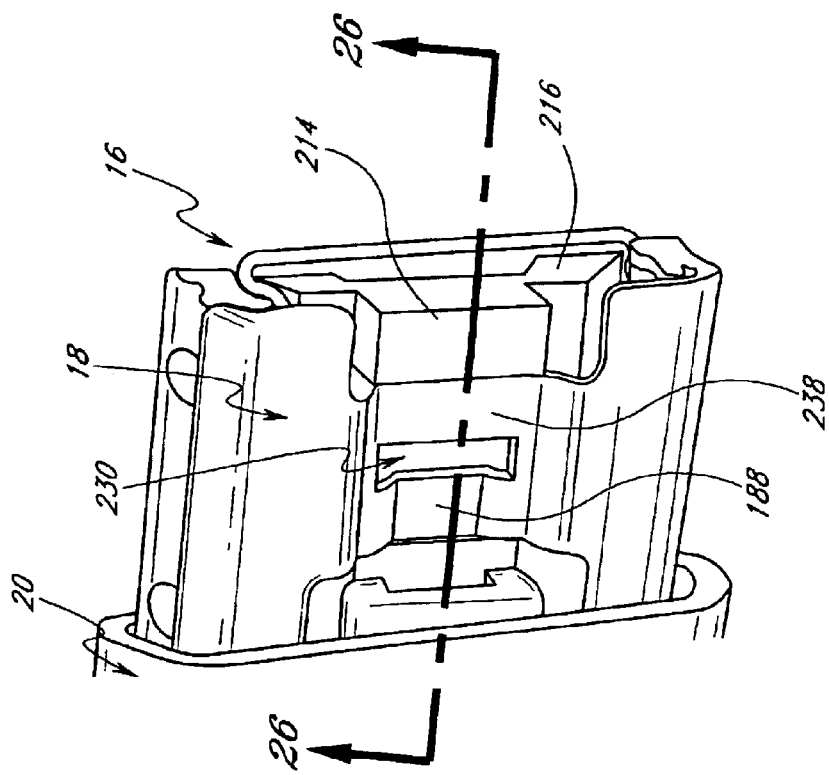
FIG. 25 is a perspective view of the forward ends of the load-carrying slide segment, intermediate slide segment, and outer slide segment of the slide assembly of FIG. 1, with the lock arm of the load-carrying slide segment disengaged from the engagement surface of the intermediate slide segment and showing the reset feature of the elongated release member.

FIGS. 23–25 illustrate the release member 200 installed into the inner slide segment 16. The release member chamfered front edge 208 contacts the inwardly bent lip 175a and rides over the second end of the lock arm 174, while the release member stop tab 212 is biased toward the inner slide segment side wall 64, which is configured with a cutout 230 having a corresponding width to allow the stop tab 212 to fit within the cutout 230. As the release member 200 is inserted into the inner slide segment channel 56, the stop tab 212 is resiliently biased into the cutout 230, which prevents unintentional withdrawal of the release member 200 from the channel 56. The release member 200 is inhibited from further displacement into the channel 56 by a protrusion 224 on the lock arm 170 that interferes with the front edge 208 of the release member as it slides over the lock arm 170. Therefore, the release member's 200 motion is limited in a withdrawing, or outward, direction 232 by the interference of the stop tab 212 with a cutout engaging edge 222, and in an inserting, or inward, direction 236 by the lock arm protrusion 224. Of course, the release member 200 may be intentionally removed from the inner slide segment channel 56 by forcing the stop tab 212 out of the cutout 230, thereby uninhibiting the release member's travel in a withdrawing direction 232. Once installed, the total travel distance of the release member 200 is within the range of from about ⅛ inch to 2 inches. In one embodiment, the release member 200 travel distance is about ¼ inch, although it may be greater or less depending on the specific embodiment.

The lock arm's second end 174 slopes toward the inner slide segment 16 as it nears the release member 200. Therefore, during operation, as the release member 200 slides over the second end 174, it resiliently depresses the lock arm 170. As the lock arm 170 is depressed, the window 176 is biased away from the engagement surface (188 of FIG. 10) of the intermediate slide segment 18 thus actuating the release mechanism and the inner slide segment 16 is free to move relative to the intermediate slide segment 18. Thus, by sliding the release member 200 inward, the release mechanism is actuated and the inner slide segment 16 is free to retract into the intermediate slide segment 18.

Advantageously, the release member 200 provides access to the release mechanism at the front of the slide assembly, such that a technician is not required to reach toward the rear of the inner slide segment 16. This offers a tremendous convenience because the technician can see the release actuator while in front of the server computer and does not have to reach around the server computer and feel around for the release actuators. Moreover, since the force to actuate the release mechanisms is in the same direction as a retracting force on the server computer, by applying a sufficient force to each release member 200, a technician can unlock the slide assemblies and retract the server computer with a single motion.

Once the release members 200 depress the lock arm 170, the resiliency of the lock arm 170 imparts a force on the release member that is substantially normal to the lock arm second end 174. Not only does this create friction between the lock arm 170 and the release member 200, but the force causes the release member 200 to frictionally engage the inner surface of the upper and lower walls 60, 62 of the inner slide segment 16. The combined friction is sufficient to inhibit the further movement of the release member 200, and the lock arm 170 is maintained in its depressed state. Therefore, once the release mechanism is actuated, it remains actuated until the release member is reset to its initial position. The advantage from this characteristic is that a technician need not apply simultaneous force to both release mechanisms in order to retract the computer server. A first release mechanism may be activated by a first actuation force applied to a first release member 200 of a first slide assembly 12a, followed by a second release mechanism being activated by a second actuation force applied to a second release member 200 of a second slide assembly 12a, and then the technician is free to use his hands to apply a retracting force on the server computer. Furthermore, a single technician is able to operate a pair of slide assemblies in those applications in which the pair of slide assemblies are spaced too far apart for a technician to simultaneously reach and actuate both of them.

Figure 26:
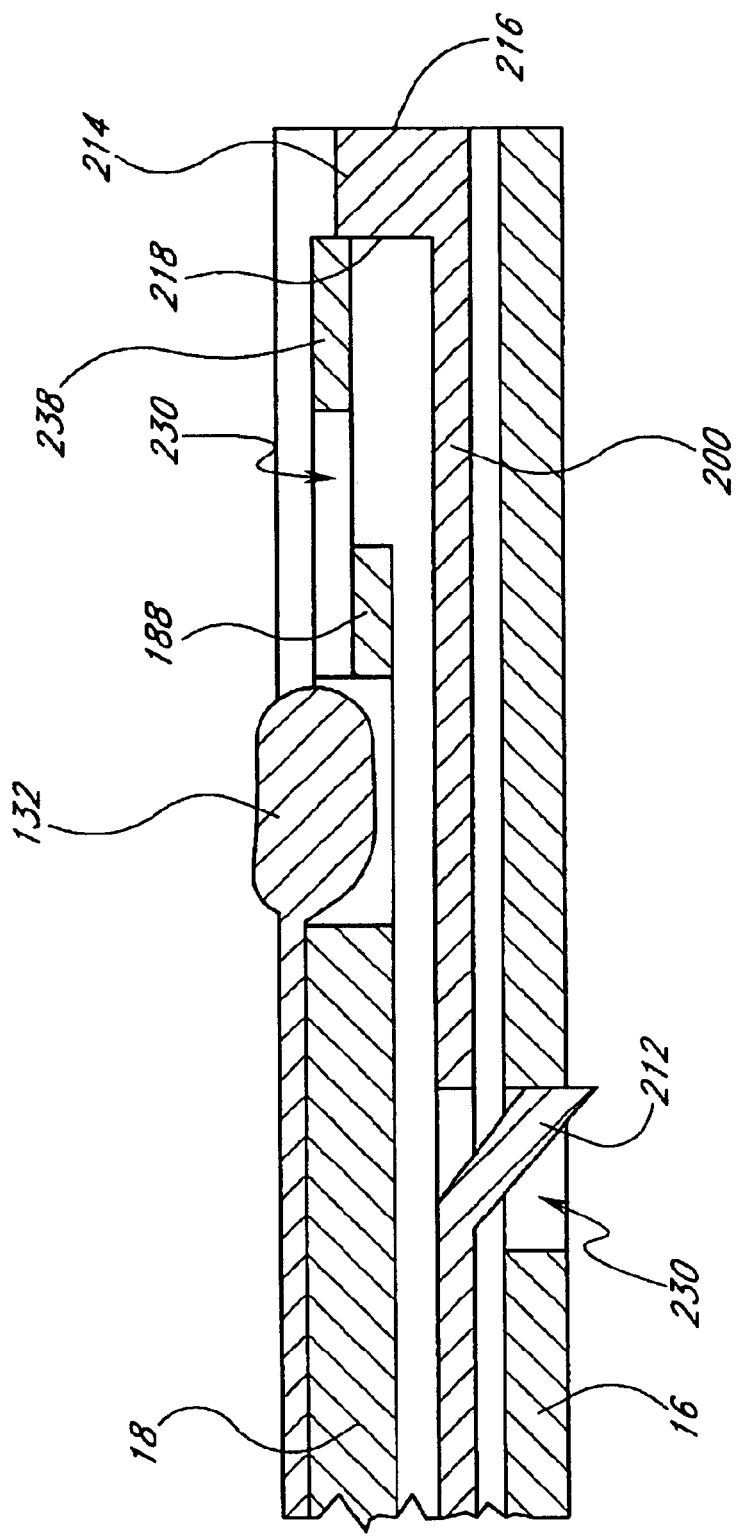
FIG. 26 is a cross sectional view of the slide assembly of FIG. 25 showing the interaction between the release mechanism components.

As illustrated in FIGS. 25 and 26, the release mechanism is reset upon full retraction of the inner slide segment 16 into the intermediate slide segment 18 by a reset tab 238. As the inner slide segment 16 is retracted completely into the intermediate slide segment 18, the reset tab 238 contacts the reset surface 218 of the release member flange 214 and prevents its further movement relative to the intermediate slide segment 18 while the inner slide segment 16 continues to retract into the intermediate slide segment 18. Thus, the release member 200 is reset to its initial position in which the push surface 216 is substantially flush with the front edge of the inner slide segment 16 and the lock arm 170 is released from a depressed position. Thus, once the release mechanism is actuated, it remains actuated until the release mechanism is reset by fully retracting the inner slide segment 16 into the intermediate slide segment 18 and the inner slide segment 16 is fully extended once again. In order for the fully retracted assembly to be flush along the forward ends, the reset tab 238 is recessed from the intermediate slide segment's forward end a distance equal to the length of the flange 214. However, depending on the desired operation of the front release mechanism, the push surface 216 may be initially disposed beyond the front edge of the inner slide segment 16, or may be initially disposed retracted within the inner slide segment 16. For instance, the push surface 216 may be initially positioned beyond the inner slide segment 16 such that it may even extend beyond the load carried thereby. This could facilitate easier actuation of the release mechanism because the actuator would be disposed in front of the load carried by the slide assemblies.

Thus, a simple to manufacture, assemble, and operate front release mechanism is provided that (1) is fully contained within the channels of the slide segments, (2) securely maintains a computer server in a fully extended position out of the server rack, and (3) remains released until the slide assembly is fully retracted thereby resetting the mechanism.

Although the illustrated slide assembly embodiments include an inner slide segment 16, 16a, an intermediate slide segment 18, 18a, and an outer slide segment 20, 20a, those skilled in the art will recognize that the locking and release mechanisms described herein can be incorporated in slide assemblies having two or more slide segments. Thus, the locking and release mechanisms can be incorporated in slide assemblies having more than one intermediate slide segment, or no intermediate slide segment.

Figure 27:
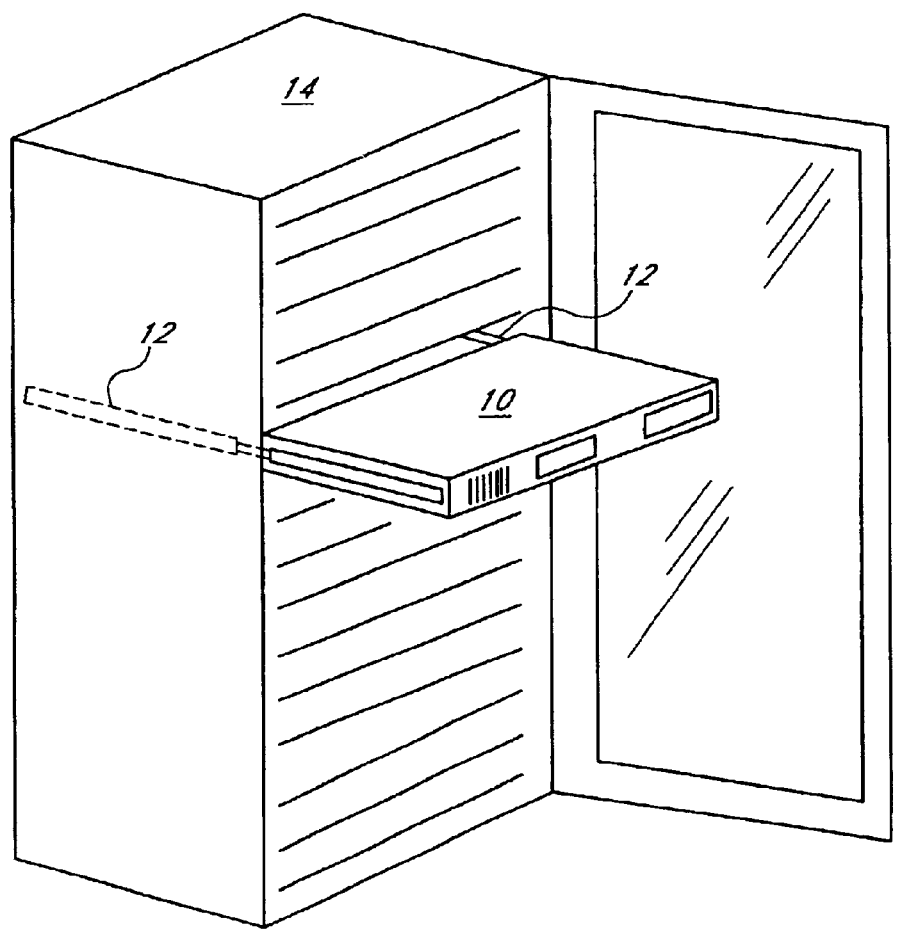
FIG. 27 illustrates one embodiment of a slide assembly in which a pair of slide assemblies cooperatively carry a server computer within a server rack.

FIG. 27 shows one embodiment of a slide assembly adapted to support a computer server housed within a server rack 14. A server rack 14 is traditionally in the form of a cabinet and includes a plurality of spaces for housing server computers 10. A slide assembly 12 has a stationary slide segment securely attached to the rack structure and a load-carrying slide segment attached to a carriage or load. In the illustrated embodiment, the carriage is a server computer 10. It is preferable that a pair of cooperating slide assemblies are mounted on opposing walls of the rack 14 and server computer 10 to adequately support the server computer 10 as it is slidably alternated between extended and retracted positions relative to the server rack 14; however, the slide assemblies can also be mounted underneath the server computer 10. This particular operating environment allows a server computer to be extended beyond the confines of the server rack 14 and is particularly helpful in providing a secure position in which to perform maintenance on the server computer 10. However, the slide assembly embodiment described herein are not solely adaptable to the operating environment depicted in FIG. 27. Additional applications and environments will be readily apparent to those of skill in the art including the support of various types of loads, and varying mounting locations, such as opposing sides, undermount, or above mounted slide assemblies.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A slide assembly, comprising:
   a stationary slide segment comprising an upper wall, a lower wall, and a side wall extending between said upper and lower walls, said side wall and said upper and lower walls defining a first channel;
   an intermediate slide segment movable in said first channel to extend outwardly or retract inwardly said slide assembly, said intermediate slide segment comprising an upper wall, a lower wall, and a side wall extending between said upper and lower walls, said upper and lower walls defining a second channel, said side wall defining an engagement surface;
   a load-carrying slide segment movable in said second channel to extend or retract said slide assembly, said load-carrying slide segment comprising an upper wall, a lower wall, and a side wall extending between said upper and lower walls thereby defining a third channel;
   a lock arm extending from said side wall of said load-carrying slide segment toward said intermediate slide segment side wall, said lock arm engageable with said engagement surface to limit movement of said load-carrying slide segment with respect to said intermediate slide segment; and
   a front release mechanism comprising an elongate release member slidably disposed within said third channel and contacting said upper and lower walls, said elongate release member movable between a first position and a second position, wherein in said first position a front end of said elongate release member is aligned with a front end of said load-carrying slide segment and said elongate release member does not engage said lock arm and in said second position said elongate release member is moved further into said third channel such that said front end of said elongate release member is spaced inwardly from said front end of said load-carrying slide segment and in said second position said elongate release member is configured to engage said lock arm and displace said lock arm thereby disengaging said lock arm and said engagement surface, said elongate release member actuatable from a front end of said load-carrying member and, once actuated, remains in said second position until said slide assembly is moved to a fully retracted position.

2. The slide assembly as in claim 1, wherein said lock arm is a resilient cantilevered spring securely attached to said load-carrying member side wall.

3. The slide assembly as in claim 2, wherein said lock arm further defines a window formed therein.

4. The slide assembly as in claim 3, wherein said engagement surface comprises a protrusion extending away from said intermediate slide segment side wall and configured to fit within said window.

5. The slide assembly as in claim 1, wherein said elongate release member is configured such that an inward displacement of said release member causes displacement of said lock arm in a plane that is substantially transverse to a vertical plane.

6. The slide assembly as in claim 1, wherein said release member further comprises a stop tab configured to engage a portion of said load-carrying slide segment thereby inhibiting undesired withdrawal of said release member from said load-carrying slide segment.

7. The slide assembly as in claim 1, further comprising a reset feature configured to align a front end of said release member with said front end of said load-carrying slide segment.

8. The slide assembly as in claim 7, wherein said reset feature comprises a reset tab on said intermediate slide segment configured to engage a flange formed at a front end of said release member thereby inhibiting continued retraction of said release member and thereby aligning said front ends of said release member and said load-carrying slide segment as said load-carrying slide segment is fully retracted into said second channel.

9. The slide assembly of claim 1, wherein said lock arm additionally comprises at least one notch, said slide assembly additionally comprising an actuator carried by said intermediate slide segment and defining at least one catch, said catch configured to engage said notch such that said intermediate slide segment is extended relative to said stationary slide segment along with extension of said load-carrying slide segment.

10. The slide assembly of claim 9, wherein said actuator is also configured to selectively displace said lock arm thereby disengaging said lock arm and said engagement surface.

11. A telescoping slide assembly comprising interconnected load-carrying, intermediate, and stationary slide members movable relative to one another to extend in an outward direction and retract in an inward direction, the load-carrying and intermediate slide members movable relative to the stationary slide member between fully extended and retracted positions, the intermediate slide member interconnecting the load-carrying slide member and the stationary slide member, said slide assembly having a lock-out mechanism for locking said slide assembly in said fully extended position, said lock out mechanism comprising:
- a resilient cantilevered lock arm having a first end secured to said load-carrying member, a middle section extending toward said intermediate slide segment, and a second end terminating in a lip, said lip configured with a window formed therein for receiving a protrusion formed on said intermediate slide member;
- a protrusion extending from said intermediate member toward said load-carrying member and configured to fit within said lock arm window when said load-carrying member is fully extended;
- an elongated release member slidably disposed within a channel of said load-carrying member such that a first end is adjacent to said lock arm lip and a second end is adjacent to an outward end of said load-carrying member and wherein said elongated release member contacts an upper wall and a lower wall of said load-carrying member; and
- wherein translating said elongated release member inwardly causes said elongated release member first end to depress said lock arm lip thereby elastically deforming said lock arm such that said lock arm window moves away from said protrusion thereby allowing relative movement of said intermediate member and said load-carrying member and wherein a force developed by said resilient lock arm does not cause movement of said elongated release member such that said elongated release member remains in an inward position until said slide assembly is moved to a fully retracted position.

12. The slide assembly of claim 11, wherein said lock arm additionally comprises at least one notch, said slide assembly additionally comprising an actuator carried by said intermediate slide member and defining at least one catch, said catch configured to engage said notch such that said intermediate slide member is extended relative to said stationary slide member along with extension of said load-carrying slide segment.

13. The slide assembly of claim 12, wherein said actuator is also configured to selectively depress said lock arm lip thereby elastically deforming said lock arm such that said lock arm window moves away from said protrusion.

14. A method for unlocking and retracting a load carried by a pair of extended slide assemblies in which each slide assembly comprises a release member is selectively movable between a locked position and a release position, the method comprising:
- applying a first actuating force toward a rearward end of a first one of said slide assemblies to a first release member thereby moving said first release member to said release position, wherein said first release member remains in said release position;
- applying a second actuating force toward a rearward end of a second one of said slide assemblies to a second release member thereby moving said second release member to a release position, wherein said second release member remains in said release position; and
- applying a retracting force to said load thereby retracting said slide assemblies.

15. The method of claim 14, further comprising the step of resetting said first and second release members.

16. The method of claim 14, wherein said pair of extended slide assemblies are each capable of disconnecting a load carrying segment from the remainder of said slide assembly, and wherein applying the first actuating force to said first release member and/or applying the second actuating force to the second release member allows only unidirectional movement of said load carrying segments in a retracting direction.

17. A lock-out slide mechanism for locking a telescoping slide in an extended position, said slide mechanism comprising:
- a first slide member having an outward end from which the slide telescopes and an inward end toward which the slide retracts and further having an engagement surface;
- a second slide member having an outward end and an inward end, said second slide member slidably connected to said first slide member such that the second slide member is slidable relative to said first slide member;
- a lock arm attached to said second slide member and configured to move in a direction substantially transverse to a vertical plane and having an interference surface configured to engage said engagement surface thereby inhibiting the movement of said second slide member relative to said first slide member; and
- an elongated lock release member slidably positioned along said second slide member and contacting an upper wall and a lower wall of said second slide member, said elongated lock release configured such that inwardly displacing said elongated lock release member displaces said lock arm in a direction substantially transverse to a vertical plane thereby disengaging said interference surface from said engagement surface thus allowing relative movement of said second slide member and said slide member, and wherein once displaced inwardly said elongated lock release remains displaced inwardly until said slide mechanism is fully retracted.

18. The lock-out slide mechanism of claim 17, wherein said elongated lock release member is securely held by said second slide member.

19. The lock-out slide mechanism of claim 17, wherein said lock arm is fixedly attached to said second slide member.

20. The lock-out slide mechanism of claim 19, wherein said lock arm is formed of a resilient material.

21. The lock-out slide mechanism of claim 17, wherein said elongated release member is displaceable a distance within the range of about one eighth to one half of an inch.

22. The lock-out slide mechanism of claim 21, wherein said elongated release member is displaceable a distance of about one quarter of an inch.

23. The lock-out slide mechanism of claim 17, wherein said elongated release member is a single piece.

24. The slide assembly of claim 17, wherein said lock arm additionally comprises at least one notch, said slide assembly additionally comprising a third slide member and an actuator, said third slide member telescopingly supporting said second slide member and said first slide member, said actuator carried by said first slide member and defining at least one catch, said catch configured to engage said notch such that said first slide member is extended relative to said third slide member along with extension of said load-carrying slide segment.

25. The slide assembly of claim 24, wherein said actuator is also configured to displace said lock arm thereby disengaging said lock arm and said engagement surface.

26. A slide mechanism comprising:
- an outer slide member of a generally C-shaped section having a pair of upper and lower bearing raceways facing vertically inward;

an intermediate slide member of a generally C-shaped section having a pair of upper and lower bearing raceways facing vertically outward and further having a first interengaging surface;

a first plurality of upper and lower bearings in rolling engagement with respective upper and lower bearing raceways of the outer and intermediate slide members;

an inner slide member of a generally C-shaped section defining a longitudinal channel therein and having a pair of upper and lower bearing raceways facing vertically outward;

a second plurality of upper and lower bearings in rolling engagement with the pair of upper and lower bearing raceways of the inner slide member and a second pair of opposed vertically inward facing upper and lower raceways of the intermediate slide member;

a lock arm fixedly attached to an inward surface of said inner slide member and defining a second interengaging surface configured to engage said first interengaging surface on said intermediate slide member to inhibit the relative movement therebetween; and an elongated release member slidably disposed within said inner slide member channel and contacting inwardly facing surfaces of said upper bearing raceways and said lower bearing raceways, said elongated release member held in place by the inner slide member channel and further configured to translate longitudinally to displace said lock arm and thereby disengage said first interengaging surface and said second interengaging surface, wherein once said elongated release member is translated to a position to displace said lock arm, said elongated release member remains in said position until said slide mechanism is moved to a fully retracted position.

27. The slide mechanism according to claim 26, wherein said elongated release member engages said lock arm such that said lock arm is resiliently deflected away from said first interengaging surface.

28. The slide mechanism as in claim 26, wherein said first interengaging surface comprises a tab extending from said intermediate slide member toward said inner slide member and is configured to fit within a window formed in said lock arm when said inner slide member is in a fully extended position.

29. The slide mechanism as in claim 26, wherein said elongated release member is held in place by walls defining the generally C-shaped section of said inner slide member channel.

30. The slide assembly of claim 26, wherein said lock arm additionally comprises at least one notch, said slide assembly additionally comprising an actuator carried by said intermediate slide member and defining at least one catch, said catch configured to engage said notch such that said intermediate slide member is extended relative to said outer slide member along with extension of said load-carrying slide segment.

31. The slide assembly of claim 30, wherein said actuator is also configured to displace said lock arm thereby disengaging said first interengaging surface and said second interchanging surface.

32. A carriage carried by a pair of telescoping slide assemblies wherein said slide assemblies each comprise a plurality of telescoping slide segments movable between an extended position and a retracted position wherein a first slide segment is mounted to a stationary structure and a second slide segment is fixed to said carriage, wherein each of said slide assemblies further comprise a lock-out mechanism that locks said slide assemblies in an extended configuration, and further comprising a front lock release mechanism for releasing said lock by actuating a release member disposed generally at a front end of said second slide segment, wherein said front lock release mechanism contacts an upper wall and a lower wall of said second slide segment and maintains said lock-out mechanism in a released state until reset and wherein said release mechanism is reset upon full retraction of said second slide segment.

33. The carriage according to claim 32, wherein the carriage is a computer.

34. The carriage according to claim 32, further comprising a removal mechanism whereby said second slide segment is removable from said slide assembly.

* * * * *